United States Patent
Aoshima

(10) Patent No.: US 6,716,566 B2
(45) Date of Patent: Apr. 6, 2004

(54) NEGATIVE PLANOGRAPHIC PRINTING PLATE

(75) Inventor: Keitaro Aoshima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 246 days.

(21) Appl. No.: 09/895,401

(22) Filed: Jul. 2, 2001

(65) Prior Publication Data

US 2003/0073032 A1 Apr. 17, 2003

(30) Foreign Application Priority Data

Jul. 7, 2000 (JP) ........................... 2000-207153

(51) Int. Cl.$^7$ ............... G03F 7/075; G03F 7/11; G03F 7/038
(52) U.S. Cl. ............... 430/273.1; 430/280.1; 430/270.1; 430/944; 430/912; 430/176; 430/177; 430/964; 430/914; 430/921; 430/925; 430/927; 430/916; 430/288.1; 430/281.1; 430/285.1; 430/284.1; 430/283.1
(58) Field of Search ............... 430/280.1, 270.1, 430/944, 912, 273.1, 176, 177, 964, 914, 921, 925, 927, 916, 288.1, 281.1, 285.1, 284.1, 283.1

(56) References Cited

U.S. PATENT DOCUMENTS

| 4,510,227 | A | | 4/1985 | Mohr et al. | |
|---|---|---|---|---|---|
| 5,340,699 | A | | 8/1994 | Haley et al. | |
| 5,705,322 | A | | 1/1998 | West et al. | |
| 5,919,601 | A | | 7/1999 | Nguyen et al. | |
| 5,965,319 | A | * | 10/1999 | Kobayashi | ............ 430/176 |
| 6,013,412 | A | * | 1/2000 | Aoshima | ............ 430/270.1 |
| 6,399,689 | B1 | * | 6/2002 | Scarlette | ............ 430/176 |
| 6,423,462 | B1 | * | 7/2002 | Kunita | ............ 430/156 |

FOREIGN PATENT DOCUMENTS

| EP | 0 779 161 A1 | | 6/1997 | | |
|---|---|---|---|---|---|
| EP | 0 950 517 | | 10/1999 | | |
| EP | 0 950 518 A1 | | 10/1999 | | |
| EP | 1 072 955 A2 | * | 1/2001 | ........... G03F/7/095 |
| JP | 08-062834 a | * | 3/1996 | ........... G03G/7/004 |

* cited by examiner

Primary Examiner—Cynthia Hamilton
(74) Attorney, Agent, or Firm—Burns, Doane, Swecker & Mathis, LLP

(57) ABSTRACT

There is provided a negative planographic printing plate which can be directly recorded based on digital data from computers and the like, excellent in storage stability, shows no reduction in sensitivity with the lapse of time, and has excellent face flatness. It comprises a substrate having disposed thereon a photosensitive layer which is obtained by applying a photosensitive layer application solution containing an infrared absorber, a compound which generates a radical or acid due to heat, a polymerizable compound or a crosslinking compound, and a silicon-based surfactant such as a siloxane/oxyethylene copolymer and the like, onto the substrate and drying the solution, and which is hardened by exposure to an infrared laser ray.

18 Claims, No Drawings

NEGATIVE PLANOGRAPHIC PRINTING PLATE

BACKGROUND OF THE INVENTION

1. Field of the Invention

The present invention relates to a negative planographic printing plate which can manifest a so-called direct process in which preparation can be directly effected by scanning with infrared laser based on digital signals from computers and the like.

2. Description of the Related Art

Recently, there are remarkable developments in lasers. Particularly, solid laser and semiconductor laser which emit an infrared ray having a wavelength from 760 nm to 1200 nm and show high output and have small size are easily available. These lasers are very useful as a recording light source in direct preparation of planographic printing plates based on digital data from computers and the like. However, a lot of photosensitive recording materials which are practically useful have photosensitive wavelengths in visible range of not more than 760 nm, therefore, images can not be recorded by these infrared lasers. Thus, material which can be recorded by infrared laser are desired.

As such image recording materials which can be recorded by infrared laser, there is a recording material composed of an onium salt, phenol resin and spectral sensitizing agent described in U.S. Pat. No. 4,708,925. This image recording material is a positive image recording material utilizing an effect of suppressing dissolution into a developing solution, the effect being manifested by the onium salt and phenol resin, and is not a negative material as embodied in the present invention. On the other hand, as the negative image recording material, U.S. Pat. No. 5,340,699 describes a recording material composed of an infrared absorber, acid generator, resol resin and novolak resin. However, such a negative image recording material requires, for forming image, heating treatment after exposure to laser, therefore, a negative image recording material requiring no heating treatment after exposure has been desired.

For example, JP-B No. 7-103171 describes a recording material requiring no heating treatment after image-wise exposure, the material being composed of a cyanine pigment having a specific structure, an iodonium salt and an addition-polymerizable compound having an ethylenically unsaturated double bond. However, in the case of this image recording material, there are problems that when a photosensitive layer application solution is applied, a uniform photosensitive layer is not formed easily due to non-uniformity in film thickness caused by contact with an application means such as a bar coater and the like, and when a photosensitive layer is formed and stored immediately without exposure and preparation, long-term stability is not sufficient, and sensitivity lowers with the lapse of time.

For enhancing uniformity of a photosensitive layer, there are investigations on compounding of various surfactants into an application solution. However, use of usual nonionic surfactants do not easily allow sensitivity to be stable with the passage of time, and in the case of use of fluorine-based surfactants, although relatively uniform coated films are obtained, there is a problem that fluorine-based surfactants which have been localized on the surface of the photosensitive layer immediately after application and drying mix with the photosensitive layer with the lapse of time, resultantly, leading to reduction in sensitivity. That is, in current situations, there is no means found yet which does not lower the property of a photosensitive layer, improve the face flatness of the formed photosensitive layer, and can suppress reduction in sensitivity with the lapse of time.

SUMMARY OF THE INVENTION

Therefore, an object of the present invention is to provide a negative planographic printing plate which can be directly recorded based on digital data from computers and the like by conducting recording using solid laser and semiconductor laser emitting an infrared ray, excellent in storage stability, reveals no reduction in sensitivity with the lapse of time, and has excellent face flatness.

The present inventors have directed their attention to the property of a surfactant used in a recording layer application solution for a negative planographic printing plate, and intensively studied this. As a result, they found that a recording layer having excellent and uniform face flatness and having excellent long-term stability can be obtained by using a silicon-based surfactant which is one kind of organometal-based surfactants, thus leading to completion of the present invention.

Namely, the negative planographic printing plate of the present invention can be recorded by infrared laser, and has a constitution in which a photosensitive layer which is obtained by applying and drying a photosensitive layer application solution containing an infrared absorber, a compound which generates a radical or acid due to heat, a polymerizable compound or crosslinking compound, and a silicon-based surfactant, and which is hardened by exposure to infrared laser, is provided on a substrate.

In the planographic printing plate of the present invention, it may be advantageous that at least a photosensitive layer is formed on a substrate, and other layers, for example, an intermediate layer, overcoat layer, backcoat layer and the like, can be provided according to the object, providing they do not deteriorate the effect of the present invention.

Although the action of the present invention is not explicit, it is speculated that a silicon-based surfactant contained in a photosensitive layer application solution manifests high surface activity even at low concentration and is useful for solubilizing an organic solvent and polymer and for dispersing and stabilizing an infrared absorber, and due to high surface tension of the application solution, the solution surface is quickly smoothed immediately after application of a photosensitive layer on a substrate, thus excellent face flatness is obtained. Further, as a solvent of a photosensitive layer application solution is removed while applying and drying, the silicon-based surfactants become localized on and near the surface of a photosensitive layer, and permeation of moisture from air through the surface into a photosensitive layer can be suppressed by action of hydrophobic group of the surfactants. Consequently, it is also advantageous in storage of a plate that lowering in sensitivity with reduction in light-heat conversion efficiency due to permeation of moisture into a photosensitive layer can be efficiently prevented, and that sliding property on the surface of a photosensitive is improved and scratch-resistance in storage is enhanced.

DESCRIPTION OF THE PREFERRED EMBODIMENTS

The present invention will be described in detail below.

The feature of the present invention is the inclusion of a silicon-based surfactant in a photosensitive layer.

[Silicon-Based Surfactant]

Examples of the silicon-based surfactant used in the photosensitive layer application solution of the present invention include surfactants having Si in the main chain of the molecule. Any of cationic surfactants such as amine salts, quaternary ammonium salts and the like, nonionic surfactants containing an alkylene oxide in the main chain, so-called silicon-based surfactants having a siloxane skeleton, and the like may be used.

Since the various functions of the silicon-based surfactant such as a surface activity, ability to solubilize an organic solvent, ability to stabilize dispersion of solid fine particles such as a pigment and the like differ in accordance with the kinds and numbers of hydrophilic groups and hydrophobic groups included therein, and the like, the silicon-based surfactant is appropriately selected in view of affinity with various components used in a photosensitive layer, required surface activity, dispersing property, and the like. Generally, from the standpoint of effects, nonionic surfactants are preferable, and among them, silicone-based surfactants typified by a siloxane/oxyethylene copolymer are preferable.

Examples of the silicon-based surfactant which can be used in the present invention include, but are not limited to, the following compounds.

Anionic

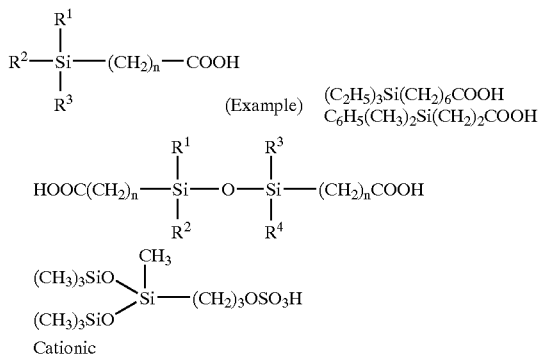

Cationic

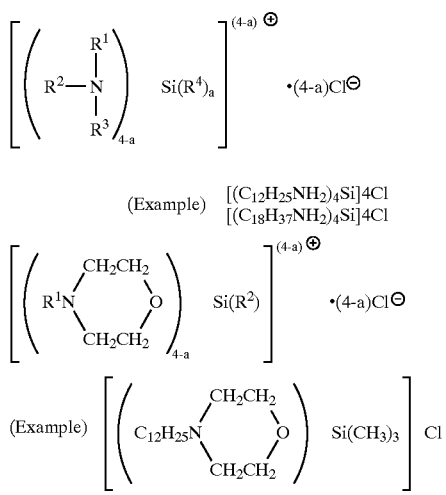

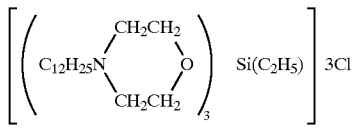

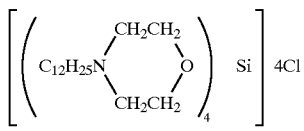

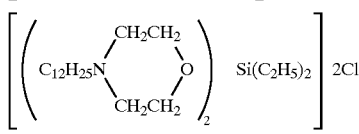

Nonionic
$HO(C_2H_4O)_3SiC_2H_4COO(C_2H_4O)_3H$
$(CH_3)_3SiC_6H_4OC_2H_4OH$
$C_{18}H_{37}Si[O(C_2H_4O)_nH]_3$
(Silicone-Based)
$[(CH_3)_3SiO]_3C_3H_6O(C_2H_4O)_{12.2}CH_3$
$[(CH_3)_3SiO]_3OSi(CH_3)C_3H_6O(C_2H_4O)_{9.2}CH_3$
$[(CH_3)_3SiO(CH_3)_2SiO]_2OSi(CH_3)C_3H_6O\ (C_2H_4O)_{12.6}CH_3$
$[(CH_3)_2SiO]_4[OSi(CH_3)_2C_3H_6O(C_2H_4O)_{7.5}CH_3]_2$
$[(CH_3)_3CO]_2Si(CH_3)C_3H_6O(C_2H_4O)_{8.2}CH_3$
$[(t\text{-butyl})(CH_3)_2SiO]_2Si(CH_3)C_3H_6O(C_2H_4O)_{13.2}CH_3$
$(n\text{-octyl})(CH_3)_2SiOSi(CH_3)_2C_3H_6O(C_2H_4O)_{16.1}CH_3$

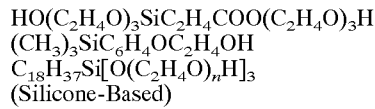

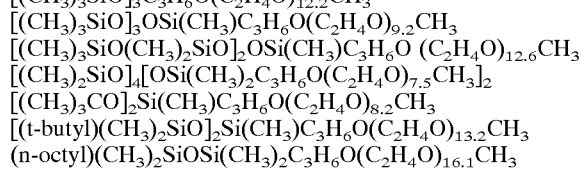

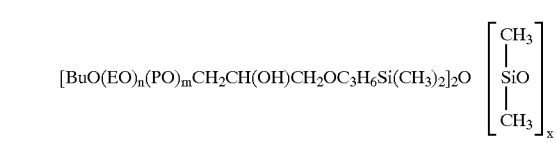

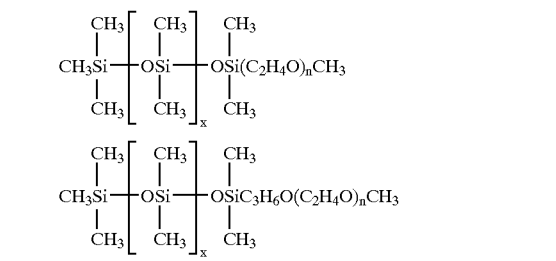

In the formulae, each of $R^1$ to $R^4$ independently represents an alkyl group.

The photosensitive layer coating solution of the present invention contains the above-mentioned silicon-based surfactant in an amount preferably from 0.01 to 8% by weight, further preferably from 0.05 to 4% by weight based on the total weight of nonvolatile components in the photosensitive layer. If the content is too small, an effect of improving long-term stability and an effect of improving scratch-resistance become insufficient, and if too large, applied face flatness deteriorates. That is, neither case is desirable.

Next, other components contained in a photosensitive layer will be described.

The photosensitive layer of the planographic printing plate of the present invention is not particularly restricted providing it is a layer in which writing by infrared laser is possible, namely, it is a negative photosensitive layer in which portions irradiated with infrared laser are hardened to form image portions. Any such negative layers may be used.

One such negative photosensitive layers is a photopolymerizable layer. The photopolymerizable layer contains (A)

an infrared absorber, (B) a radical generator (a radical polymerization initiator) and (C) a radical-polymerizable compound which causes a polymerization reaction when it reacts with the generated radical and is thereby hardened, and preferably, (D) a binder polymer. The infrared absorber converts absorbed an infrared ray into heat. The heat generated in this conversion decomposes a radical polymerization initiator such as an onium salt and the like to generate a radical. The radical-polymerizable compound is selected from compounds having at least one ethylenically unsaturated double bond, and at least one, and preferably two or more terminal ethylenically unsaturated bonds. The generated radical causes chain polymerization reactions, and result in hardening.

Another example of an embodiment of the photosensitive layer is an acid crosslinking layer. The acid crosslinking layer contains (E) a compound which generate an acid due to exposure to light or heat (hereinafter, referred to as acid generator) and (F) a compound which is crosslinked by the generated acid (hereinafter, referred to as crosslinking agent), and further, contains (G) an alkali-soluble polymer which can react with a crosslinking agent in the presence of an acid to form a layer containing these compounds. In this acid crosslinking layer, an acid generated by decomposition of an acid generator by light irradiation or heating promotes the action of a crosslinking agent, and a strong crosslinked structure is formed between crosslinking agents or between a crosslinking agent and a binder polymer, and due to this, alkali-solubility decreases, causing a developing agent to be insoluble. Here, an infrared absorber (A) is compounded in the photosensitive layer for efficient use of infrared laser energy.

Next, the photosensitive layer is described. The photosensitive layer according to the image formation material of the present invention contains (A) an infrared absorber, (B) an onium salt, (C) a radical-polymerizable compound and (D) a binder polymer. These constituent components will be described sequentially.

[(A) Infrared Absorber]

On the planographic printing plate of the present invention, images can be recorded by laser which emits infrared rays. Therefore, it is essential to use an infrared absorber. The infrared absorber functions to convert the absorbed infrared rays into heat. Due to heat generated in this reaction, an onium salt decomposes to generate a radical. The infrared ray absorber used in the present invention may be an infrared absorber which manifests absorption at a wavelength for a laser for writing and can convert light into heat, and is preferably a dye or pigment showing an absorption maximum in the wavelength range from 760 nm to 1200 nm.

As the dye, commercially available dyes and, known materials described in literatures such as, for example, "Dye Manual" (edited by Yuki Gosei Kagaku Kyokai, 1970) and the like can be used. Specifically, dyes such as azo dyes, metal complex salt azo dyes, pyrazoloneazo dyes, naphthoquinone dyes, anthraquinone dyes, phthalocyanine dyes, carbonium dyes, quinoneimine dyes, methine dyes, cyanine dyes, squarylium pigments, pyrylium salts, metal thiolate complexes and the like can be used.

Preferable examples of the dye include cyanine pigments described in JP-A Nos. 58-125246, 59-84356, 59-202829, 60-78787 and the like, methine pigments described in JP-A Nos. 58-173696, 58-181690 and 58-194595 and the like, naphthoquinone pigments described in JP-A Nos. 58-112793, 58-224793, 59-48187, 59-73996, 60-52940, 60-63744 and the like, squarylium pigments described JP-A No. 58-112792 and the like, cyanine pigments described in GB-Patent No. 434,875, etc.

Further, near infrared absorbing sensitizers described in U.S. Pat. No. 5,156,938 can also be preferably used, and preferable are arylbenzo(thio)pyrylium salts described U.S. Pat. No. 3,881,924, trimethinethiapyrylium salts described in JP-A No. 57-142645 (U.S. Pat. No. 4,327,169), pyrylium-based compounds described in JP-A Nos. 58-181051, 58-220143, 59-41363, 59-84248, 59-84249, 59-146063 and 59-146061, cyanine pigments described in JP-A No. 59-216146, pentamethinethiopyrylium salts and the like described in U.S. Pat. No. 4,283,475, pyrylium compounds described in JP-B Nos. 5-13514 and 5-19702.

Further, as other preferable examples of the dyes include near infrared absorption dyes of the formulae (I) and (II) described in U.S. Pat. No. 4,756,993.

Among these dyes, particularly preferable are cyanine pigments, squarylium pigments, pyrylium salts and nickel thiolate complexes. Further, cyanine pigments are preferable, and particularly, cyanine pigments of the following general formula (1) are most preferable.

General Formula (1)

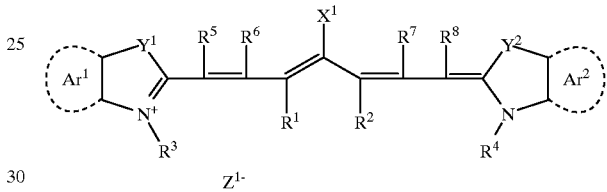

In General Formula (1), $X^1$ represents a halogen atom or $X^2$-$L^2$ or $NL^2N^3$. Here, $X^2$ represents an oxygen atom or sulfur atom, and $L^1$ represents a hydrocarbon group having 1 to 12 carbon atoms. Each of $L^2$ and $L^3$ independently represents a hydrocarbon group having 1 to 12 carbon atoms. Each of $R^1$ and $R^2$ independently represents a hydrocarbon group having 1 to 12 carbon atoms. From the standpoint of storage stability of a photosensitive layer application solution, $R^1$ and $R^2$ are preferably a hydrocarbon group having 2 or more carbon atoms, and further, it is particularly preferable that $R^1$ and $R^2$ are connected to each other to form a 5-membered or 6-membered ring.

$Ar^1$ and $Ar^2$ may be the same or different, and represent an aromatic hydrocarbon group optionally having a substituent. Examples of preferable aromatic hydrocarbon group include a benzene ring and a naphthalene ring. Further, examples of the preferable substituent include hydrocarbon groups having 12 or less carbon atoms, halogen atoms, and alkoxy groups having 12 or less carbon atoms. $Y^1$ and $Y^2$ may be the same or different, and represent a dialkylmethylene group having 12 or less sulfur atoms or carbon atoms. $R^3$ and $R^4$ may be the same or different, and represent a hydrocarbon group having 20 or less carbon atoms optionally having a substituent. Preferable substituents are alkoxy groups having 12 or less carbon atoms, carboxyl group and sulfo group. $R^5$, $R^6$, $R^7$ and $R^8$ may be the same or different, and represent a hydrogen atom or a hydrocarbon group having 12 or less carbon atoms. From the standpoint of availability, they preferably represent a hydrogen atom. $Z^{1-}$ represents a counter anion. However, when any of $R^1$ to $R^8$ is substituted with a sulfo group, $Z^{1-}$ is not necessary. As $Z^{1-}$, preferable are halogen ions, perchlorate ion, tetrafluoroborate ion, hexafluorophosphate ion and sulfonate ion, and particularly preferable are a perchlorate ion, hexafluorophosphate ion and arylsulfonate ion, from the standpoint of storage stability of a photosensitive layer application solution.

Specific examples of cyanine pigments of General Formula (1) which can be suitably used in the present invention are those described in Japanese Patent Application No. 11-310623, paragraph nos. [0017] to [0019 ].

The pigment used in the present invention, commercially available pigment, and pigments described in Color Index (C. I.) manual, "Saishin Ganryo Binran (current pigment manual)" (edited by Nippon Ganryo Gijutsu Kyokai, 1977), "Saishin Ganryo Oyo Gijutsu (current pigment application technology)" (published by CMC, 1986), "Insatsu Inki Gijutsu (printing ink technology)" (published by CMC, 1984) can be utilized.

Examples of the pigments include black pigments, yellow pigments, orange pigments, brown pigments, red pigments, violet pigments, blue pigments, green pigments, fluorescent pigments, metal powder pigments, and additionally, polymer bond pigments. Specifically, insoluble azo pigments, azolake pigments, condensed azo pigments, chelate azo pigments, plithalocyanine-based pigments, anthraguinone-based pigments, perylene and perynone-based pigments, thioindigo-based pigments, quinacridone-based pigments, dioxazine-based pigments, isoindolinone-based pigments, quinophthalone-based pigments, dyeing lake pigments, azine pigments, nitroso pigments, nitro pigments, natural pigments, fluorescent pigments, inorganic pigments, carbon black and the like can be used. Of these pigments, preferable is carbon black.

These pigments may be used without being surface-treated, or may be surface-treated before use. The method of surface treatment may be surface coating with a resin or wax, adhering a surfactant, bonding a reactive substance (for example, silane coupling agent, epoxy compound, polyisocyanate and the like) to the surface of a pigment, or the like. The above-mentioned surface treatment methods are described in "Kinzoku Sekken no Seitshitsu to Oyo (nature and application of metal soap)" (Sachi Publication), "Insatsu Inki Gijutsu (printing ink technology)" (published by CMC, 1984), and "Saishin Ganryo Oyo Gijutsu (current pigment application technology)" (published by CMC, 1986).

The pigment particle size is preferably from 0.01 μm to 10 μm, further preferably from 0.05 μm to 1 μm, and particularly preferably from 0.1 μm to 1 μm. A pigment particle size of less than 0.01 μm is not preferable from the standpoint of instability of a dispersed substance in an application solution of an image photosensitive layer, and a particle size of over 10 μm is not preferable from the standpoint of uniformity of an image photosensitive layer.

As the method of dispersing a pigment, known dispersing technologies used in production of ink, production of toners, and the like can be used. Examples of dispersing machine include a ultrasonic disperser, sand mill, attriter, pearl mill, super mill, ball mill, impeller, disperser, KD mill, colloid mill, Dynatron, triple screw roll mill, press kneader and the like. The details are described in "Saishin Ganryo Oyo Gijutsu (current pigment application technology)" (published by CMC, 1986).

In the present invention, since a silicon-based surfactant excellent in pigment dispersibility is contained in a photosensitive layer application solution, even if a pigment which is a solid component and has more excellent long-term stability with the passage of time than a dye is used, local variation in sensitivity due to unequal distribution of the pigment does not occur easily, and a uniform photosensitive layer can be formed.

These infrared absorbers may be included, together with other components, in the same layer, or in another layer. It is preferable, when a negative planographic printing plate is formed, that the optical density at absorption maximum in the range from 760 nm to 1200 nm of a photosensitive layer is between 0.1 to 3.0. When the optical density in the absorption maximum in the range from 760 to 1200 nm is out of this range, sensitivity tends to lower. Since optical density is determined by the amount of the above-mentioned infrared absorber included and the thickness of a recording layer, a desired optical density is obtained by controlling conditions of both parameters. The optical density of a recording layer can be measured by usual method. As the measuring method, there are, for example, a method in which a recording layer having a thickness determined to be appropriate for the application amount after drying to be in a range required for a planographic printing plate is formed on a transparent or white substrate and the optical density is measured by a transmission type optical densitometer, a method in which a recording layer is formed on a reflective substrate such as aluminum and the like, and the reflection density is measured, and other methods.

[(B) Compound Which Generates Radical]

As the compound generating a radical which is suitably used in the present invention, onium salts are preferably used. Specifically, iodonium salts, diazonium salts and sulfonium salts may be used. Although these onium salts functions as an acid generator, they function as an initiator for radical polymerization when the onium salts are used together with a radical polymerizable compound described later. The onium salts suitably used in the present invention are onium salts of the following general formulae (2) to (4).

General Formula (2)

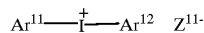

General Formula (3)

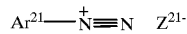

General Formula (4)

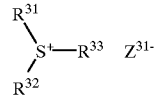

In the formula (2), each of $Ar^{11}$ and $Ar^{12}$ independently represents an aryl group having 20 or less carbon atoms and may have a substituent. When this aryl group has a substituent, preferable examples of the substituent include halogen atoms, nitro group, alkyl groups having 12 or less carbon atoms, alkoxy groups having 12 or less carbon atoms, or aryloxy groups having 12 or less carbon atoms. $Z^{11-}$ represents a counter ion selected from the group consisting of halogen ions, perchlorate ion, tetrafluoroborate ion, hexafluorophosphate ion, carboxylate ion and sulfonate ion, and preferable are a perchlorate ion, hexafluorophosphate ion and arylsulfonate ion.

In the formula (3), $Ar^{21}$ represents an aryl group having 20 or less carbon atoms which may have a substituent. As the preferable substituent, halogen atoms, nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino groups having 12 or less carbon atoms and diarylamino groups having 12 or less carbon atoms are listed. $Z^{21-}$ represents a counter ion as defined for $Z^{11-}$.

In General Formula (4), $R^{31}$, $R^{32}$ and $R^{33}$ may be the same or different, and represent a hydrocarbon group having 20 or less carbon atoms and may have a substituent. Examples of the preferable substituent include halogen atoms, nitro group, alkyl groups having 12 or less carbon atoms, aryloxy groups having 12 or less carbon atom. $Z^{31-}$ represents a counter ion as defined for $Z^{11-}$.

As the specific examples of onium salts which can be suitably used in the present invention, there are listed those described in Japanese Patent Application No. 11-310623, paragraph nos. [0030] to [0033], and Japanese Patent Application No. 2000-160323, paragraph nos. [0015] to [0046], filed previously by the present applicant.

The onium salt used in the present invention has a maximum absorption wavelength preferably of 400 nm or less, and further preferably of 360 nm or less. By thus controlling the absorption wavelength within the ultraviolet region, a planographic printing plate can be handled under white light.

These onium salts can be included in a photosensitive layer application solution in a proportion of from 0.1 to 50% by weight, preferably from 0.5 to 30% by weight, and particularly preferably from 1 to 20% by weight based on the total weight of all solid components in the photosensitive layer application solution. When the amount included is less than 0.1% by weight, sensitivity lowers, and when over 50% by weight, staining occurs on non-image portions in printing. These onium salts may be used alone or in combination of two or more. Further, these onium salts may be included, together with other components, in the same layer, or in another layer which may be provided separately.

[(C) Radical Polymerizable Compound]

The radical polymerizable compound used in the present invention is a radical polymerizable compound having at least one ethylenically unsaturated double bond, and selected from compounds having at least one, and preferably two or more terminal ethylenically unsaturated bonds. Such a compound group is widely known in the art, and in the present invention, these compounds can be used without specific restriction. These have a chemical form, such as, for example, a monomer, prepolymer, namely, dimer, trimer and oligomer, or a mixture thereof and a copolymer thereof, or the like. As examples of a monomer and copolymer thereof, there are listed unsaturated carboxylic acids (e.g., acrylic acid, methacrylic acid, itaconic acid, crotonic acid, isocrotonic acid, maleic acid and the like), esters thereof, and amides, and preferably, esters of an unsaturated carboxylic acid with an aliphatic polyhydric alcohol compound, or amides of an unsaturated carboxylic acid with an aliphatic polyvalent amine compound, are used. Further, unsaturated carboxylates having a nucleophilic substituent such as a hydroxyl group, amino group, mercapto group and the like, adducts of amides with monofunctional or polyfunctional isocyanates, or epoxies, dehydration condensation reaction products with a monofunctional or polyfunctional carboxylic acid, and the like are suitably used. Further, adducts of an unsaturated carboxylate having an electrophilic substituent such as an isocyanate group, epoxy group and the like, or amides with monofunctional or polyfunctional alcohols, amines and thiols, and, substitution reaction products of an unsaturated carboxylate having a releasable substituent such as a halogen group, tosyloxy group and the like, or amides with monofunctional or polyfunctional alcohols, amines and thiols, are also suitable. As other examples, compounds obtained by substituting the above-mentioned unsaturated carboxylic acid by an unsaturated phosphonic acid, styrene and the like can also be used.

Specific examples of acrylates, methacrylates, itaconates, crotonates, isocrotonates and maleates which are a radical polymerizable compound which is an ester of a aliphatic polyhydric alcohol compound with an unsaturated carboxylic acid are described in Japanese Patent Application No. 11-310623, paragraph nos. [0037] to [0042], and these compounds can also be applied to the present invention.

As examples of other esters, aliphatic alcohol-based esters described in JP-B Nos. 46-27926, 51-47334 and 57-196231, esters having an aromatic skeleton described in JP-A Nos. 59-5240, 59-5241 and 2-226149, esters having an amino group described in JP-A No. 1-165613, and the like can also be suitably used.

Specific examples of a monomer of an amide of an aliphatic polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide and the like.

Examples of other preferable amide-based monomers include monomers having a cyclohexylene structure described in JP-B No. 54-21726.

Further, urethane-based addition polymerizable compounds produced by using an addition reaction of an isocyanate with a hydroxyl group are also preferable. Specific examples thereof include vinylurethane compounds containing two or more polymerizable vinyl groups in one molecule obtained by adding a vinyl monomer having a hydroxyl group of the following general formula (5) to a polyisocyanate compound having two or more isocyanate groups in one molecule described in JP-B No.48-41708, and the like.

$$CH_2=C(R^{41})COOCH_2CH(R^{42})OH \qquad \text{General Formula (5)}$$

(wherein, $R^{41}$ and $R^{42}$ represent H or $CH_3$) Also, urethane acrylates as described in JP-A No. 51-37193, JP-B Nos. 2-32293 and 2-16765, and urethane compounds having an ethylene oxide-based skeleton described in JP-B Nos. 58-49860, 56-17654, 62-39417 and 62-39418 are preferable.

Further, radical polymerizable compounds having an amino structure or sulfide structure in the molecule described in JP-A Nos. 63-277653, 63-260909 and 1-105238 may also be used.

Other examples include polyfunctional acrylates and methacrylates, such as polyester acrylates as described in JP-A Nos. 48-64183 and 49-43191 and JP-B No. 52-30490, epoxy acrylates obtained by reacting an epoxy resin with a (meth)acrylic acid, and the like. Furthermore, specific unsaturated compounds described in JP-B Nos. 46-43946, 1-40337 and 1-40336, and vinylphosphonic acid-based compounds described in JP-A No. 2-25493, and the like can also be used. In some cases, structures containing a perfluoroalkyl group described in JP-A No. 61-22048 are suitably used. Further, those introduced as photosetting monomers and oligomers in Nippon Secchaku Kyokai Shi (Japanese Adhesion Institution Journal) vol. 20, No. 7, pp. 300 to 308 (1984) can also be used.

Details of the method for using these radical polymerizable compounds such as the kind of structure used, single use or combined use, the addition amount, and the like, can be optionally set according to the desired functions of the final recording material. For example, the use conditions are selected from the following standpoints. Regarding sensitivity, a structure having high content of unsaturated groups per molecule is preferable. In many cases, a structure having two or more unsaturated functional groups is preferable. For enhancing the strength of an image portion, namely, a hardened film, a structure having three or more functional groups is preferably used. Combination of compounds having different number of functional groups and different polymerizable groups (e.g., acrylate-based compound, methacrylate-based compound, styrene-based compound and the like) is preferably used for controlling both photosensitivity and strength. Compounds having large molecular weight and compounds having high hydrophobicity may be, in some cases, not preferable from the standpoints of developing speed and deposition in a development solution although they are excellent in sensitivity and film strength. Also, selection and use methods of a radical polymerizable compound are important factors in dispersibility and compatibility with other components (e.g., binder polymer, initiator, coloring agent and the like) in a photosensitive layer. For example, compatibility can be sometimes improved by use of a compound having low purity or combined use of two or more compounds. Further, a specific structure may be selected, in some cases, for the purpose of improving close adherence of a substrate, an overcoat layer, and the like. A higher compound ratio of a radical polymerizable compound in an image recording layer is advantageous for sensitivity. However, when it is too high, problems may occur such as undesirable phase separation, problems in production processes due to adherence of an image recording layer (for example, transfer of recording layer components, production failure as a result of close adhesion), occurrence of deposition from a development solution, and the like. From these standpoints, the preferable compounding ratio of a radical polymerizable compound is, in may cases, from 5 to 80% by weight, preferably from 20 to 75% by weight based on the total weight of all components in the composition. These may be used alone or in combination of two or more. In addition, regarding the method for using a radical polymerizable compound, a suitable structure, compounding ratio and addition amount can be optionally selected from the standpoints of the extent of polymerization inhibition on oxygen, resolution, fogging property, variation in refractive index, surface stickiness, and the like. Further, in some cases, layer structures and application methods such as priming and finishing can also be preferably used.

[(D) Binder Polymer]

In the present invention, a binder polymer is further used. As the binder, a linear organic polymer is preferably used. Any such "linear organic polymer" may be used. Preferably, for enabling development with water or development with weak alkaline water, linear organic polymers which are soluble or swellable in water or weak alkaline water are selected. The linear organic polymer is selected for use, based not only on use as a film forming agent for forming a photosensitive layer, but also on use with water, weak alkaline water or organic solvent developer. For example, when a water-soluble organic polymer is used, developing with water becomes possible. As such a linear organic polymer, there are radical polymers having a carboxyl group as the side chain, for example, those described in JP-A No. 59-44615, JP-B Nos. 54-34327, 58-12577 and 54-25957, JP-A No. 54-92723, 59-53836 and 59-71048, namely, methacrylic acid copolymers, acrylic acid copolymers, itaconic acid copolymers, crotonic acid copolymers, maleic acid copolymers, partially esterified maleic acid copolymer, and the like. Further, there are also acidic cellulose derivatives having a carboxyl group as the side chain. In addition, those obtained by adding a cyclic acid anhydride to a polymer having a hydroxyl group, and the like, are useful.

Particularly, among those compounds, (meth)acrylic resins having a benzyl group or allyl group, and a carboxyl group as the side chains are preferable since they are excellent in attaining balance between film strength, sensitivity and developing property.

Furthermore, urethane-based binder polymers having an acidic group which are described in JP-B Nos. 7-12004, 7-120041 and 7-120042, JP-B No. 8-12424, JP-A Nos. 63-287944, 63-287947 and 1-271741, Japanese Patent Application No. 10-116232, and the like are advantageous in terms of printing-endurance and suitable for low exposure since they are very strong.

In addition, polyvinylpyrrolidone, polyethylene oxide and the like are useful as a water-soluble linear organic polymer. For enhancing the strength of a hardened film, alcohol-soluble nylon, polyether of 2,2-bis-(4-hydroxyphenyl)-propane with epichlorohydrin, and the like are also useful.

The weight-average molecular weight of a polymer used in the present invention is preferably 5000 or more, further preferably in the range from 10000 to 300000, and the number-average molecular weight is preferably 1000 or more, further preferably in the range from 2000 to 250000. The degree of polydispersion (weight-average molecular weight/number-average molecular weight) is preferably 1 or more, and further preferably in the range from 1.1 to 10.

These polymers may be any of random polymers, block polymers, graft polymers and the like, and preferable are random polymers.

A polymer used in the present invention can be synthesized by a conventionally known method. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water and the like. These may be used alone or in mixture of two or more.

As the radical polymerization initiator used in synthesizing a polymer used in the present invention, known compounds such as azo-based initiators, peroxide initiators, and the like can be used.

Binder polymers used in the present invention may be used alone or in mixture. These polymers are added into a photosensitive layer in a proportion of from 20 to 95% by weight, and preferably from 30 to 90% by weight based on the total amount of all solid components in a photosensitive layer application solution. If the addition amount is less than 20% by weight, the strength of image portions is insufficient after images are formed. If the addition amount is over 95% by weight, images are not formed. The weight ratio of a compound having an ethylenically unsaturated double bond which can be radical-polymerized, to a linear organic polymer is preferably in the range of 1/9 to 7/3.

Next, constituent components of an acid crosslinking layer will be described. The infrared absorber used herein may be the same infrared absorber (A) described for the above-mentioned photopolymerization layer.

The amount included is preferably from 0.01 to 50% by weight, more preferably from 0.1 to 10% by weight based on the total weight of all solid components in a photosensitive layer. In the case of a dye, it is most preferably from 0.5 to 10% by weight. In the case of a pigment, it is most preferably from 1.0 to 10% by weight.

If the amount included is less than 0.01% by weight, sensitivity may decrease, and if the amount is over 50% by weight, staining may occur on non-image portions when a planographic printing plate is formed.

[(E) Acid Generator]

In this embodiment, the acid generator which is decomposed due to heat to generate an acid refers to a compound which generates an acid when irradiated with light having a wavelength range from 200 to 500 nm or by heating to 100° C. or more.

Examples of the acid generator include known compounds, mixtures thereof and the like which can be thermally decomposed to generate an acid, such as photo-initiators utilizing photo-cation-polymerization, photoinitiators utilizing photo-radical-polymerization, photo-decoloring agents for dyes, photo-discoloring agents, or known acid generators used in a micro resist and the like, etc.

Examples include diazonium salts described in S. I. Schlesinger, Photogr. Sci. Eng., 18, 387 (1974), T. S. Bal et al., Polymer, 21, 423 (1980); ammonium salts described in U.S. Pat. No. 4,069,055, JP-A No. 4-365049 and the like; phosphonium salts described in U.S. Pat. Nos. 4,069,055 and 4,069,056; iodonium salts described in EP No. 104,143, U.S. Pat. Nos. 339,049 and 410,201, JP-A Nos. 2-150848 and 20296514; sulfonium salts described in EP Nos. 370, 693, 390, 214, 233,567, 297,443 and 297,442, U.S. Pat. Nos. 4,933,377, 161,811, 410,201, 339,049, 4,760,013, 4,734,444 and 2,833,827, German Patent Nos. 2,904,626, 3,604,580 and 3,604,581, selenonium salts described in J. V. Crivello et al., Macromolecules, 10(6), 1307 (1977), J. V. Crivello et al., J. Polymer Sci., Polymer Chem. Ed., 17, 1047 (1979); onium salts such as arsonium salts and the like described in C. S. Wen et at., The, Proc. Conf. Rad. Curing ASIS, p478 Tokyo, Cot (1988); organic halogen compounds described in U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339; organic metal/organic halides described in JP-A 2-161445, photo-acid generators described in EP Nos. 0290,750, 046,083, 156,535, 271,851 and 0,388,343, U.S. Pat. Nos. 3,901,710 and 4,181,531, JP-A Nos. 60-198538 and 53-133022; compounds which are photo-decomposed to generate a sulfonic acid, typified by iminosulfonate and the like described in EP Nos. 0199,672, 84515, 196,672, 044,115 and 0101,122, U.S. Pat. Nos. 4,618,564, 4,371,605 and 4,431,774, JP-A Nos. 64-18143 and 2-245756, Japanese Patent Application No. 3-140109; and disulfone compounds described in JP-A No. 61-166544.

Also, compounds obtained by introducing these groups or compound generating an acid into the main chain or side chain of a polymer are listed suitably. Examples include compounds described in U.S. Pat. No. 3,849,137, German Patent No. 3,914,407, JP-A Nos. 63-26653, 55-164824, 62-69263, 63-146037, 63-163452, 62-153853 and 63-146029.

Further, compounds which generate an acid by being irradiated with light, described V. N. R. Pillai, Synthesis, (1), 1(1980), A. Abad et al., Tetrahedron Lett., (47) 4555 (1971), D. H. R. Barton et al., J. Chem. Soc., (B), 329 (1970), U.S. Pat. No. 3,779,778 and EP No. 126,712 can also be used.

Among the acid generators, compounds of the following general formulae (6) to (10) are preferable.

General Formula (6)

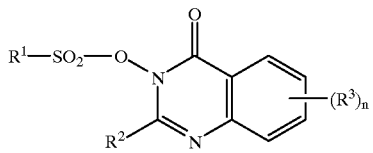

General Formula (7)

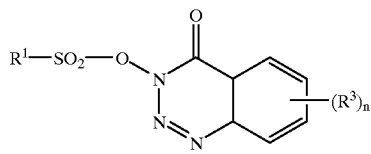

General Formula (8)

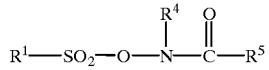

General Formula (9)

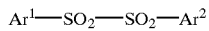

General Formula (10)

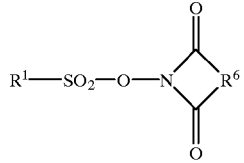

In General Formula (6) to (10), $R^1$, $R^2$, $R^4$ and $R^5$ may be the same or different, and represent a hydrocarbon group which has 20 or less carbon atoms and may have a substituent. $R^3$ represents a halogen atom and a hydrocarbon group or an alkoxy group which have 10 or less carbon atoms and may have a substituent. $Ar^1$ and $Ar^2$ may be the same or different, and represent an aryl group which has 20 or less carbon atoms and may have a substituent. $R^6$ represents a divalent hydrocarbon group which has 20 or less carbon atoms and may have a substituent. n represents an integer from 0 to 4.

In the formulae, $R^1$, $R^2$, $R^4$ and $R^5$ are preferably hydrocarbon groups having 1 to 14 carbon atoms.

Preferable embodiments of the acid generators of General Formula (6) to (10) are described in detail in Japanese Patent Application No.11-320997, paragraph nos. [0197] to [0222], filed previously by the present inventors. These compounds can be synthesized, for example, by methods described in JP-A Nos. 2-100054 and 2-100055.

Examples of the acid generator (E) include onium salts having as a counter ion a halide, sulfonic acid and the like. Among these, an iodonium salt, a sulfonium salt and a diazonium salt having a structure represented by the following general formulae (11) to (13) are preferably used.

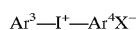 General Formula (11)

General Formula (12)

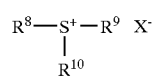

 General Formula (13)

In General Formula (11) to (13), $X^-$ represents a halide ion, $ClO_4^-$, $PF_6^-$, $SbF_6^-$, $BF_4^-$ or $R^7SO_3^-$, wherein $R^7$ represents a hydrocarbon group which has 20 or less carbon atoms and may have a substituent. Each of $Ar^3$ and $Ar^4$ independently represents an aryl group having 20 or less carbon atoms optionally having a substituent. $R^8$, $R^9$ and $R^{10}$ represent an aryl group which has 18 or less carbon atoms and may have a substituent.

Such onium salts are described as compounds of the general formulae (I) to (III) in JP-A No. 10-39509, paragraph nos. [0010] to [0035].

The amount of the acid generator included is preferably from 0.01 to 50% by weight, more preferably from 0.1 to 25% by weight, and most preferably from 0.5 to 20% by weight based on the total weight of all solid components of a recording layer.

If the amount is less than 0.01% by weight, images may not be obtained, and if over 50% by weight, staining may occur on non-image portions in printing using the resultant planographic printing plate.

The acid generators may be used alone or in combination of two or more.

[(F) Crosslinking Agent]

Next, the crosslinking agent will be explained. As the crosslinking agent, the following compounds are listed.

(i) Aromatic compounds substituted with hydroxymethyl group or alkoxymethyl group
(ii) Compounds having N-hydroxymethyl group, N-alkoxymethyl group or N-acyloxymethyl group
(iii) Epoxy compound Compounds (i) to (iii) will be described in detail below.

Examples of the aromatic compounds substituted with a hydroxymethyl group or alkoxymethyl group include aromatic compounds poly-substituted with a hydroxymethyl group, acetoxymethyl group or alkoxymethyl group, or heterocyclic compounds. However, resinous compounds obtained by polycondensing phenols with aldehydes under basic condition, which are known as resol resins, are also included.

Among the aromatic compounds poly-substituted with a hydroxymethyl group or alkoxymethyl group, or heterocyclic compounds, particularly, compounds having a hydroxymethyl group or alkoxymethyl group adjacent to a hydroxy group are preferable.

Further, among the aromatic compounds poly-substituted with an alkoxymethyl group, or heterocyclic compounds, particularly, compounds in which an alkoxymethyl group has 18 or less carbon atoms are preferable. Compounds of the following general formulae (14) to (17) are more preferable.

General Formula (14)

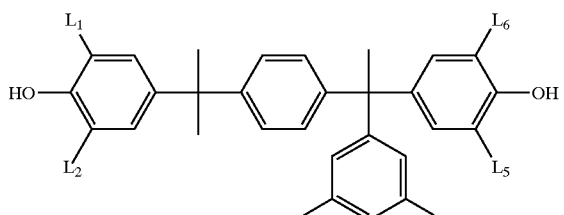

General Formula (15)

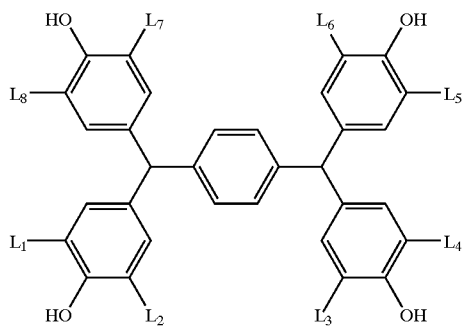

General Formula (16)

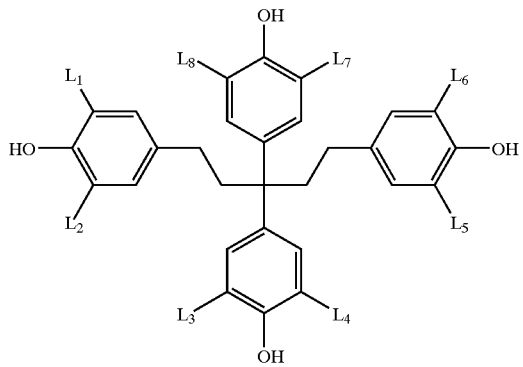

General Formula (17)

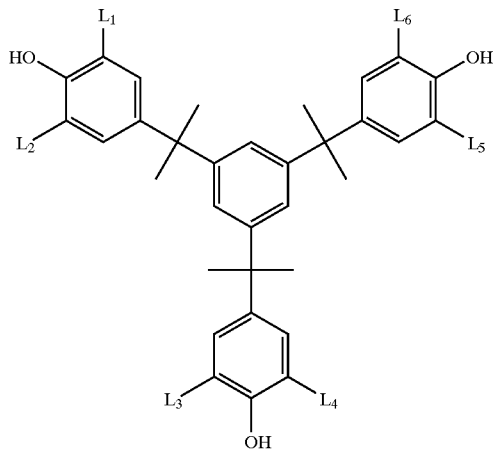

In General Formula (14) to (17), each of $L_1$ to $L_8$ independently represents a hydroxymethyl group or alkoxymethyl group substituted with an alkoxy group having 18 or less carbon atoms such as methylmethyl, ethoxymethyl or the like.

These crosslinking agents are preferable in that they have high crosslinking efficiency and can improve printing endurance.

Examples of the compound (ii) having an N-hydroxymethyl group, N-alkoxymethyl group or N-acyloxymethyl group include monomers and oligomer-melamine-formaldehyde condensates and urea-formaldehyde condensates described in European Patent Publication (hereinafter, referred to as "EP-A") No. 0,133, 216, German Patent Nos. 3,634,671 and 3,711,264, alkoxy-substituted compounds described in EP-A No. 0,212,482, and the like.

Among these, for example, melamine-formaldehyde derivatives having at least two free N-hydroxymethyl groups, N-alkoxymethyl groups or N-acryloxymethyl groups are preferable, and N-alkoxymethyl derivatives are most preferable.

As the epoxy compound (iii), epoxy polymers in the form of a monomer, a dimer, an oligomer or a polymer are preferable. Examples include a reaction product of bisphenol A with epichlorohydrin, a reaction product of a low molecular weight phenol-formaldehyde resin with epichlorohydrin, and the like.

In addition, epoxy resins which are described in U.S. Pat. No. 4,026,705 and GB Patent No. 1,539,192, are preferably used.

In the case of use of the compounds (i) to (iii) as the crosslinking agent, the addition amount thereof is preferably from 5 to 80% by weight, more preferably from 10 to 75% by weight, and most preferably from 20 to 70% by weight based on the total amount of all solid components of a photosensitive layer.

If the addition amount is less than 5% by weight, durability of a photosensitive layer of the resultant image recording material may decrease, and if over 80% by weight, stability in storage may decrease.

In the present invention, (iv) phenol derivatives of the following general formula (18) can also be preferably used as the crosslinking agent.

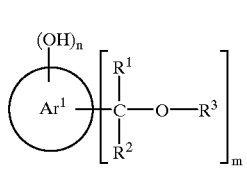

General Formula (18)

In General Formula (18), $Ar^1$ represents an aromatic hydrocarbon ring and may have a substituent.

From the standpoint of availability of raw materials, a benzene ring, naphthalene ring or anthracene ring is preferable as the aromatic hydrocarbon ring. As the substituent thereof, halogen atoms, hydrocarbon groups having 12 or less carbon atoms, alkoxy groups having 12 or less carbon atoms, alkylthio groups having 12 or less carbon atoms, cyano group, nitro group, trifluoromethyl group and the like are preferable.

Among the above-mentioned examples, $Ar^1$ more preferably represents a benzene ring or naphthalene ring having no substituents, or a halogen atom, a hydrocarbon group having 6 or less carbon atoms, an alkoxy group having 6 or less carbon atoms, an alkylthio group having 6 or less carbon atoms, or a benzene ring or naphthalene ring having a nitro group and the like as a substituent, due to possibility of high sensitization.

[(G) Alkaline Water-Soluble Polymer Compound]

As the alkaline water-soluble polymer compound which can be used in a crosslinking layer of the present invention, novolak resins and polymers having a hydroxyaryl group as the side chain are preferable. As the novolak resin, resins obtained by condensing phenols with aldehydes under acidic condition are preferable.

Among these, preferable examples include novolak resins obtained from phenol and formaldehyde, novolak resins obtained from m-cresol and formaldehyde, novolak resins obtained from p-cresol and formaldehyde, novolak resins obtained from o-cresol and formaldehyde, novolak resins obtained from octylphenol and formaldehyde, novolak resins obtained from m-/p-mixed cresol and formaldehyde, novolak resins obtained from a phenol/cresol (may be m-, p-, o- or m-/p-, m-/o-, o-/p- mixed type) mixture and formaldehyde, high molecular weight novolak resins having high ortho bonding ratio obtained by using phenol and p-formaldehyde as raw materials and reacting them at high pressure in sealed condition without using a catalyst, and the like.

The novolak resin may be preferably selected from those having a weight-average molecular weight from 800 to 300000 and a number-average molecular weight from 400 to 60000, according to the object.

Further, the above-mentioned polymers having a hydroxyaryl group as the side chain are also preferable. The hydroxyaryl group in this polymer is preferably an aryl group to which one or more OH groups are bonded.

The aryl group is preferably a phenyl group, naphthyl group, anthracenyl group, phenanthrenyl group and the like. Among these, a phenyl group or naplithyl group is preferable from the standpoints of easy availability and physical properties.

Examples of the polymer having a hydroxyaryl group as the side chain, which can be used in this embodiment, include polymers having any one of constituent units of the following general formulae (19) to (22). However, the scope of the present invention is not limited to them.

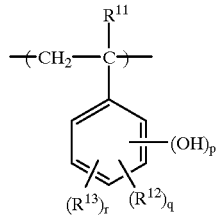

General Formula (19)

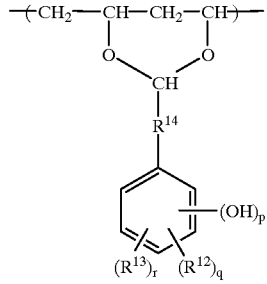

General Formula (20)

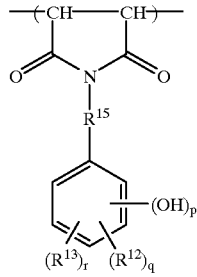

General Formula (21)

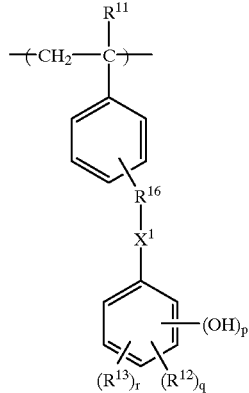

General Formula (22)

In General Formula (19) to (22), $R^{11}$ represents a hydrogen atom or methyl group. $R^{12}$ and $R^{13}$ may be the same or different, and represent a hydrogen atom, a halogen atom, a hydrocarbon group having 10 or less carbon atoms, an alkoxy group having 10 or less carbon atoms or an aryloxy group having 10 or less carbon atoms. $R^{12}$ and $R^{13}$ may be bonded or ring-condensed to form a benzene ring or cyclohexane ring. $R^{14}$ represents a single bond or a divalent hydrocarbon group having 20 or less carbon atoms. $R^{15}$ represents a single bond or a divalent hydrocarbon group having 20 or less carbon atoms. $R^{16}$ represents a single bond or a divalent hydrocarbon group having 10 or less carbon atoms. X1 represents a single bond, ether bond, thioether bond, ester bond or amide bond. p represents an integer from 1 to 4. Each of q and r independently represents an integer from 0 to 3.

These alkali-soluble polymers are described in detail in Japanese Patent Application No. 11-320997, paragraph nos. [0130] to [0163], filed previously by the present inventors.

The alkaline water-soluble polymer compounds which can be used in the present embodiment may be used alone or in combination of two or more.

The amount of the alkaline water-soluble polymer compound used is preferably from 5 to 95% by weight, more preferably from 10 to 95% by weight, and most preferably from 20 to 90% by weight based on the total amount of all solid components in a photosensitive layer.

When the amount of the alkaline water-soluble polymer compound is less than 5% by weight, durability of a recording layer may deteriorate, and when over 95% by weight, images may not be formed.

[Other Components of Photosensitive Layer]

In the present invention, various compounds other than the above-mentioned components may also be added, if necessary. For example, dyes manifesting large absorption in the visible range can be used as an agent for coloring images. Specifically, Oil Yellow #101, Oil Yellow #103, Oil Pink #312, Oil Green BG, Oil Blue BOS, Oil Blue #603, Oil Black BY, Oil Black BS, Oil Black T-505 (these are manufactured by Orient Chemical Industry Co.), Victoria Pure Blue, Crystal Violet (CI42555), Methyl Violet (CI42535), Ethyl Violet, Rhodamine B (CI145170B), Malachite Green (CI42000), Methylene Blue (CI52015) and the like, and dyes described in JP-A No. 62-293247 are preferable. Further, pigments such as phthalocyanine-based pigments, azo-based pigments, carbon black, titanium oxide and the like can also be preferably used.

These coloring agents are preferably added since image portions can be easily distinguished from non-image portions when such coloring agents are used. The amount is preferably 0.01 to 10% by weight based on the total amount of all solid components in a photosensitive layer application solution.

In the present invention, it is desirable to add a small amount of heat polymerization inhibitor for inhibiting unnecessary heat polymerization of a compound having a radical-polymerizable ethylenically unsaturated double bond, during preparation or storage of a photosensitive layer application solution. As the heat polymerization inhibitor, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-N-phenylhydroxylaminealuminum salts and the like are preferable. The amount of the heat polymerization inhibitor is preferably from about 0.01% by weight to about 5% by weight based on the weight of the whole composition. If necessary, for preventing polymerization inhibition by oxygen, a higher fatty acid derivative or the like such as behenic acid or behenic amide may be added and allowed to exist locally on the surface of a photosensitive layer during a drying process which is carried out after application. The amount of the higher fatty acid derivative is preferably from about 0.1% by weight to about 10% by weight based on the whole composition.

The photosensitive layer application solution of the present invention can obtain properties such as, for example, improvement of uniformity of an application solution, increased treatment stability with respect to the development conditions, and the like. Furthermore, in accordance with the object of the present invention, in addition to a silicon-based surfactant as described above, nonionic surfactants as described in JP-A Nos. 62-251740 and 3-208514 and ampholytic surfactants as described in JP-A Nos. 59-121044 and 4-13149 can be added, Specific examples of the ampholytic surfactant include alkyldi(aminoethyl)glycine, alkylpolyaminoethyiglycine hydrochloride, 2-alkyl-N-carboxyethyl-N-hydroxyethylimidazolinium betaine, N-tetradecyl-N,N-betaine type (for example, Amogen K (trade name), manufactured by Daiichi-Kogyo K.K.), and the like.

Specific examples of the ampholytic surfactant include alkyldi(aminoethyl)glycine, alkylpolyaminoethylglycine hydrochloride, 2-alkyl-N-carboxyethyl-N-hydroxyethylimidazolinium betaine, N-tetradecyl-N,N-betaine type (for example, Amogen K (trade name), manufactured by Diichi-Kogyo K. K.), and the like.

When the above-mentioned nonionic surfactant and ampholytic surfactant are used, the amount thereof is preferably 5% by weight or less, and more preferably 3% by weight or less based on the total amount of all non-volatile components in a photosensitive layer. Further, it is preferable, from the standpoint of effect, that the amount thereof is 60% by weight or less based on a silicon-based surfactant.

Further, a plasticizer may be added to the photosensitive layer application layer of the present invention, for imparting film flexibility, and the like, if necessary. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and the like are preferably used.

For producing the planographic printing plate of the present invention, it is usually advisable that the above-mentioned components necessary for a photosensitive layer application solution is dissolved in a solvent, and the resultant solution is applied on a suitable substrate. Examples of the solvent herein used include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-niethoxy-2-propyl acetate, dimethoxyethane, methyl lactate, ethyl lactate, N, N-dimethylacetamide, N, N-dimethylformamide, tetramethylurea, N-niethylpyrrolidone, dimethylsulfoxide, sulfolane, γ-butyro lactone, toluene, water and the like. These solvents are used alone or in admixture. The concentration of the above-mentioned components (all solid components including additives) in a solvent is preferably from 1 to 50% by weight.

The application amount (solid components) of a photosensitive layer on a substrate obtained after application and drying differs depending on use, and in the case of a planographic printing plate, it is, in general, preferably from 0.5 to 5.0 g/m². When the application amount is smaller, the apparent sensitivity increases, however, the film property of a photosensitive layer performing a function of image recording decreases.

As the method of applying a photosensitive layer application solution, various methods can be used, and for example, application using a bar coater, revolving application, spray application, curtain application, dip application, air knife application, blade application, roll application and the like are listed.

In the present invention, a photosensitive layer application solution contains a silicon-based surfactant which manifests lower surface tension even at lower concentration, therefore, when a photosensitive layer application solution containing a solvent is applied, waving of a photosensitive layer application solution formed by an application means such as a bar coater and the like used in application is quickly smoothed. Subsequently, the solvent is removed and a photosensitive layer excellent in face flatness and having uniform film thickness is thus easily formed.

On the planographic printing plate of the present invention, an overcoat layer is preferably provided for preventing polymerization inhibition caused by atmospheric oxygen in a photosensitive layer and for improving sensitivity stability.

In the overcoat layer, polyvinyl alcohol is suitably used since it can form a thin film having excellent oxygen blocking property and since it is a water-soluble polymer which is easily removed in development.

Polyvinyl alcohol may be partially substituted with an ester, ether or acetal, as long as it contains unsubstituted vinyl acetal units in a substantial amount which is necessary for it to be soluble in water. Likewise, it may also partially contain other copolymerization components. Specific examples of polyvinyl alcohol are those which have been 71 to 100% hydrolyzed and which have a degree of polymerization in the range from 300 to 2400. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, L-8 manufactured by Kuraray Co., Ltd., and the like are listed as commercially available products. As the above-mentioned copolymer, polyvinyl acetate chloro acetate or propionate which have been 88 to 100% hydrolyzed, polyvinyl formal, polyvinyl acetal, and copolymers thereof, are listed.

The content of these polyvinyl alcohol is preferably from 50 to 99.7% by weight, more preferably from 70 to 99.5% by weight based on the total weight of all solid components in an overcoat layer. When the content is less than 50% by weight, oxygen permeation-preventing effect is insufficient, and sensitivity tends to decrease, and when over 99.7% by weight, ink adhering property is less, namely, both cases are not preferable.

In this overcoat layer, other water-soluble polymers having low oxygen permeability can be used together in an amount which does not deteriorate the effect of the present invention, in addition to the above-mentioned polymers.

As the water-soluble polymers which can be used, for example, cellophane, water-soluble acrylic resins, gelatin, gum Arabic and the like are listed. These may be used alone or in combination.

Known additives such as a surfactant for improving coatability, a water-soluble plasticizer for improving physical properties of a film, and the like may be added to the overcoat layer. Example of the water-soluble plasticizer include propionamide, cyclohexane diol, glycerin, sorbitol and the like. Further, water-soluble (meth)acrylic polymers and the like may also be added. Furthermore, additives may also be added to these polymers for improving close adherence with a photosensitive layer, long-term stability, and the like.

The overcoat layer can be usually formed by dissolving the above-mentioned components into water, and applying the solution on a photosensitive layer. As the application solvent, distilled water is preferably used.

For applying an overcoat layer application solution, a known application method like those used for applying the photosensitive layer may be advantageously used. The application amount obtained after application and drying of the overcoat layer is from 0.5 to 10 g/m$^2$, preferably from 1 to 5 g/m$^2$.

[Substrate]

The substrate on which the above-mentioned photosensitive layer can be applied in the planographic printing plate of the present invention is a dimensionally stable plate. Examples thereof include paper laminated with a plastic (e.g., polyethylene, polypropylene, polystyrene and the like), metal plates (e.g., aluminum, zinc, copper and the like), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like), paper or plastic films laminated or deposited with metals as described above, and the like. The preferable substrates are polyester films or aluminum plates.

As the substrate used in the planographic printing plate of the present invention, it is preferable to use an aluminum plate which is light in weight, and has excellent surface treating property, processing property and corrosion-resistance. As the aluminum materials subjected to this object, JIS 1050 material, JIS 1100 material, JIS 1070 material, Al—Mg—based alloy, Al—Mn—based alloy, Al—Mn—Mg—based alloy, Al—Zr—based alloy, Al—Mg—Si—based alloy and the like are listed.

An Al plate having a given thickness of 0.1 to 0.5 mm may be subjected to processing by straightening apparatuses such as a roller leveler, tension leveler and the like, to improve flatness. It is advisable that the precision of the thickness of a plate is within ±10 μm, preferably within ±6 μm over the whole length. The difference in plate thickness along the width direction is within 6 μm, and preferably within 3 μm. The surface roughness of an Al plate tends to be affected by the surface roughness of a drawing roll. The final surface roughness at the center (Ra) should be between about 0.1 to 1.0. If Ra is too large, when surface roughening treatment for a planographic printing plate and application of a photosensitive layer are conducted, the original roughness of Al, namely, rough aftermarks which are transferred by a drawing roll can be seen from the upper side of a photosensitive layer, and this is undesirable in view of appearance. Roughness Ra of 0.1 μm or less is not desirable industrially, since the surface of a drawing roll is severely required not to be rough.

On the Al plate as described above, it is possible to conduct surface treatments such as roughening treatment and the like on the surface, and to apply a photosensitive layer, to obtain a planographic printing plate. As roughening treatment, mechanical roughening, chemical roughening and electrochemical roughening are conducted alone or in combination. Further, it is also preferable to conduct anodizing treatment for securing surface scratch-resistance, as well as treatment for increasing hydrophilicity.

Surface treatment of a substrate will be described below.

Prior to roughening of an aluminum plate, there may be conducted degreasing treatment with, for example, a surfactant, organic solvent or alkaline aqueous solution and the like, for removing a rolling oil on the surface, if necessary. In the case of an alkali, neutralization with an acidic solution, smut removal and the like may be subsequently conducted.

Next, treatment to roughen the surface of a substrate, a so-called graining treatment, is conducted to enhance close adherence between the substrate and a photosensitive layer and to impart water-retaining property to non-image portions. As specific graining treatment method, there are mechanical graining methods such as sand blast, ball grain, wire grain, brush grain using a nylon brush and polishing material/water slurry, horning grain in which polishing material/water slurry is sprayed at high pressure onto the surface, and the like, and chemical graining methods in which the surface is roughened by an etching agent composed of an alkali or acid or a mixture thereof. Further, there are also known an electrochemical graining method, a method combining a mechanical graining method with an electrochemical graining method, a method combining a mechanical graining method with chemical graining method using a saturated aqueous solution of an aluminum salt of a mineral acid.

Two or more of these roughening method may be carried out, and the order, number of times they are carried out and the like can be selected as desired. In the case of combination of a plurality of roughening treatments, chemical treatment using an acid or an alkali aqueous solution can be conducted, between the treatments, so that the subsequent roughening treatment can be conducted uniformly.

As specific examples of the above-mentioned acid and alkali aqueous solution, acids such as hydrofluoric acid, fluorozirconic acid, phosphoric acid, sulfuric acid, hydrochloric acid, nitric acid and the like, and alkali aqueous solutions of sodium hydroxide, sodium silicate, sodium carbonate and the like, are listed. These acids or alkali aqueous solutions can be used alone or in combination of two or more. Generally, chemical treatment is carried out for 5 to 300 seconds at a liquid temperature from 40° C. to 100° C. using a 0.05 to 40 wt % aqueous solution of these acids or alkalis.

Since smut is formed on the surface of a substrate obtained by the roughening treatment as described above, namely, by graining treatment, it is generally preferable to appropriately conduct treatments such as washing with water, alkali etching and the like, for removing this smut.

In the case of an aluminum substrate used in the present invention, it is usual, after pre-treatment as described above, to form an oxide film on the surface by anodizing, for improving abrasion-resistance, chemical-resistance and water-retaining property.

As the electrolyte used in anodizing treatment of an aluminum plate, use of any electrolyte which can form a porous oxide film is possible. In general, sulfuric acid, phosphoric acid, oxalic acid, chromic acid or a mixed acid thereof is used. The concentration of these electrolytes is appropriately selected based on the kind of the electrolyte. Treatment conditions of anodizing can not be generally specified since they change depending on electrolytes used. However, in general, it is appropriate that the concentration of electrolytes is from 1 to 80% by weight, the liquid temperature is from 5 to 70, the current density is from 5 to 60 A/dm$^2$, the voltage is from 1 to 100 V, and the electrolysis time is from 10 seconds to 5 minutes. The amount of an anodized film is suitably 1.0 g/m$^2$ or more, and more preferably in the range from 2.0 to 6.0 g/m$^2$. When the amount of an anodized film is less than 1.0 g/m$^2$, printing endurance is insufficient, and non-image portions on a planographic printing plate are easily scratched, leading to a tendency of so-called "scratch staining" in which ink adheres to scratched parts in printing.

The aluminum substrate of the present invention, after being subjected to the anodizing treatment, can be treated with an organic acid or salt thereof, or, a primer layer for application of a photosensitive layer containing the organic acid can be formed on the substrate. As the organic acid or salt thereof used, organic carboxylic acids, organic phosphonic acids, organic sulfonic acids or salts thereof and the like are listed, and preferable are organic carboxylic acids or salts thereof. As the organic carboxylic acid, there are listed aliphatic monocarboxylic acids such as formic acid, acetic acid, propionic acid, butyric acid, lauric acid, palmitic acid, stearic acid and the like; unsaturated aliphatic monocarboxylic acids such as oleic acid, linoleic acid and the like; aliphatic dicarboxylic acids such as oxalic acid, succinic acid, adipic acid, maleic acid and the like; oxycarboxylic acids such as lactic acid, gluconic acid, malic acid, tartaric acid, citric acid and the like; aromatic carboxylic acids such as benzoic acid, mandelic acid, salicylic acid, phthalic acid and the like; and metal salts and ammonium salts of Ia, Ilb, IIIb, IVa, VIb and VIII groups. Preferable among the above-mentioned salts of organic carboxylic acids are the above-mentioned metal salts and ammonium salts of formic acid, acetic acid, butyric acid, propionic acid, lauric acid, oleic acid, succinic acid and benzoic acid. These compounds may be used alone or in combination of two or more.

These compounds are preferably dissolved in water or alcohol so as to give a concentration of from 0.001 to 10% by weight, particularly from 0.01 to 1.0% by weight. A substrate is immersed in the obtained treatment solution at a temperature from 25 to 95° C., and preferably from 50 to 95° C., a pH from 1 to 13, and preferably from 2 to 10, for 10 seconds to 20 minutes, and preferably for 10 second to 3 minutes, or the treatment solution is applied on the substrate.

Further, after the anodizing treatment is carried out, treatment with a solution of the following compounds can be carried out, or these compounds can be used in a primer layer applied to the photosensitive layer. Examples of the preferably used compounds include organic phosphonic acids such as phenylphosphonic acid, naphthylphosphonic acid, alkylphosphonic acid, glycerophosphonic acid, methylenediphosphonic acid, ethylenediphosphonic acid and the like, optionally having a substituent; organic phosphoric acids such as phenylphosphoric acid, naphthylphosphoric acid, alkylphosphoric acid, glycerophosphoric acid and the like, optionally having a substituent; organic phosphinic acids such as phenylphosphinic acid, naphthylphosphinic acid, alkylphosphinic acid, glycerophosphinic acid, and the like, optionally having a substituent; amino acids such as glycine, β-alanine, valine, serine, threonine, aspartic acid, glutamic acid, arginine, lysine, tryptophan, p-hydroxyphenylglycine, dihydroxyethylglycine, anthranilic acid and the like; aminosulfonic acids such as sulfamic acid, cyclohexylsulfamic acid and the like; aminophosphonic acids such as 1-aminomethyiphosphonic acid, 1 dimethylaminoethylphosphonic acid, 2-aminoethyiphosphonic acid, 2-aminopropyiphosphonic acid, 4-aminophenylsphosphonic acid, 1-aminoethane-1,1-diphosphonic acid, 1-amino-1-phenylmethane-1, 1-diphosphonic acid, 1-dimethylaminoethan-1,1-diphosphonic acid, 1-dimethylaminobutane-1,1-diphosphonic acid, ethylenediaminetetramethyl-enephosphonic acid and the like; etc.

Further, salts of hydrochloric acid, sulfuric acid, nitric acid, sulfonic acid (methanesulfonic acid and the like) or oxalic acid with an alkali metal, ammonia, lower alkanolamine (triethanolamine and the like), lower alkylamine (triethylamine and the like) can also be preferably used.

Water-soluble polymers such as polyacrylamide, polyvinyl alcohol, polyvinylpyrrolidone, polyethyleneimine and mineral acid salts thereof, poly(meth)acrylic acid and metal salts thereof, polystyrenesulfonic acid and metal salts thereof, alkyl (meth)acrylates and 2-acrylamide-2-methyl-1-propanesulfonic acid and metal salts thereof, polymers of trialkylammoniummethylstyrene chloride and copolymers thereof with (meth)acrylic acid, polyvinylphosphonic acid and the like can also be preferably used.

Further, soluble starch, carboxymethylcellulose, dextrin, hydroxyethylcellulose, gum arabic, guar gum, sodium alginate, gelatin, glucose, sorbitol and the like can also be used preferably. These compounds may be used alone or in combination of two or more.

In treatment, these compounds are preferably dissolved in water and/or methyl alcohol so as to have a concentration of from 0.001 to 10% by weight, and particularly from 0.01 to 1.0% by weight, and a substrate is immersed in the obtained treatment solution at a temperature from 25 to 95° C., and preferably from 50 to 95° C., a pH from 1 to 13, and preferably from 2 to 10, for from 10 seconds to 20 minutes, and preferably from 10 seconds to 3 minutes.

When used as a primer layer applied to a photosensitive layer, the above-mentioned compounds is also dissolved in water and/or methyl alcohol so as to have a concentration of from 0.001 to 10% by weight, and particularly from 0.01 to 1.0% by weight, and if necessary, pH is controlled with a basic substance such as ammonia, triethylamine, potassium hydroxide and the like, or an acidic substance such as hydrochloric acid, phosphoric acid and the like, such that the solution has a pH in the range from 1 to 12. Further, yellow dyes can also be added for improving tone reproducibility of a photosensitive planographic printing plate. The coating amount of an organic primer layer after drying is appropriately from 2 to 200 mg/$M^2$, and preferably from 5 to 100 mg/$M^2$. When the coating amount is less than 2 mg/$M^2$, effects sufficient for achieving the original objects of the present invention such as stain protection and the like can not be obtained. If it is over 200 mg/$M^2$, printing endurance decreases.

An intermediate layer may also be provided for enhancing close adherence between a substrate and a photosensitive layer. For enhancing close adherence, an intermediate layer is generally composed of a diazo resin, or for example, a phosphoric acid compound which adheres to aluminum, and the like. The thickness of the intermediate layer is selected as desired, and the intermediate layer must have a thickness which allows a uniform bond formation reaction to be carried out with an upper layer of the photosensitive layer at the time of exposure. Usually, the coating ratio is preferably from about 1 to 100 mg/$m^2$, and particularly preferably from 5 to 40 mg/$m^2$, based on dried solid. The ratio of a diazo resin used in the intermediate layer is from 30 to 100%, and preferably from 60 to 100%.

A substrate which is anodized before treatment and provided with a primer layer as described above is subjected to washing with water before it can be subjected to other treatments described below, for the purpose of suppressing dissolution of an anodized film into a developing solution, suppressing formation of a residual film composed of photosensitive layer components, improving the strength of an anodized film, improving hydrophilicity of an anodized film, improving close adherence with a photosensitive layer, and the like.

One example of such a treatment is a silicate treatment in which an anodized film is allowed to contact with an aqueous solution of a silicate salt of an alkali metal. In this case, an anodized film is allowed to contact with an aqueous solution having an alkali metal silicate concentration of from 0.1 to 30% by weight, and preferably from 0.5 to 15% by weight, and a pH at 25° C. of from 10 to 13.5, at a temperature from 5 to 80° C., preferably from 10 to 70° C., and more preferably from 15 to 50° C. for 0.5 to 120 seconds. The contact method may be any method such as immersion, spraying with a spray, and the like. When the alkali metal silicate aqueous solution has a pH of less than 10, the solution gels, and when over 13.5, the anodized film dissolves.

In addition, various sealing treatments are listed, and there can be used those generally known as a method for sealing an anodized film, such as water vapor sealing, boiling water (hot water) sealing, metal salt sealing (chromate/bichromate sealing, nickel acetate sealing and the like), fat and oil immersion sealing, synthetic resin sealing, low temperature sealing (with red prussiate, alkaline earth metal earth and the like). Water vapor sealing is relatively preferable from the standpoints of function as a substrate for a printing plate (close adherence with photosensitive layer and hydrophilicity), high speed treatment, low cost, low pollution and the like. Further, immersion or spray treatment with a nitrous acid solution can be effected instead of sealing treatment or subsequent to sealing treatment.

After performing silicate treatment or sealing treatment as described above, treatment with an acidic aqueous solution and hydrophilic priming disclosed in JP-A No. 5-278362 may also be effected or organic layers disclosed in JP-A Nos. 4-282637 and 7-314937 may also be provided, for increasing close adherence with a photosensitive layer.

After performing treatment of priming and the like on the surface of a substrate, a backcoat may be provided on the rear surface of the substrate, if necessary. As this backcoat, coating layers composed of a metal oxide obtained by hydrolysis and polycondensation of an organic polymer compound described in JP-A No.5-45885 and an organic or inorganic metal compound described in JP-A No. 6-35174 are preferably used. Among these coating layers, alkoxy compounds of silicon such as $Si(OCH_3)_4$, $Si(OC_2H_5)_4$, $Si(OC_3H_7)_4$, $Si(OC_4H_9)_4$ and the like are cheap and easily available, and coating layers of a metal oxide obtained therefrom are excellent in developing solution-resistance and thus particularly preferable.

A substrate for a planographic printing plate preferably has an average roughness at the center line which is from 0.10 to 1.2 μm. If less than 0.10 μm, close adherence with a photosensitive layer decreases, leading to remarkable reduction in printing endurance. If over 1.2 μm, staining property at the time of printing deteriorates. Further, regarding the color concentration of a substrate, the reflection concentration is from 0.15 to 0.65, and if whiter than 0.15, halation in image exposure is too strong, causing a problem in image formation, and if blacker than 0.65, in plate checking operation after development, images are not seen easily, causing plate checking operation to be impaired.

The planographic printing plate of the present invention can be obtained by forming a photosensitive layer, an overcoat layer and other optional layers on a substrate obtained after predetermined treatments as described above. This planographic printing plate can be recorded with infrared laser. In the present invention, images are preferably exposed by solid laser and semiconductor laser which irradiate an infrared ray having a wavelength from 760 nm to 1200 nm. The laser output is preferably 100 mW or more, and for reducing the exposure time, it is preferable to use a multi beam laser device. Further, it is preferable that the exposure time per pixel is within 20 μseconds. The energy with which a recording material is irradiated is preferably from 10 to 300 mJ/$cm^2$.

After exposure to infrared laser, the image formation material of the present invention is preferably developed with water or an alkaline aqueous solution.

When an alkaline aqueous solution is used as a developing solution, conventionally known alkali aqueous solutions can be used as the development replenishment solutions for the image formation material of the present invention. For example, inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, lithium hydroxide and the like may be used. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like are also used.

These alkali agents are used alone or in combination of two or more.

Further, in the case of development with an automatic developing machine, it is known that a large number of planographic printing plates can be treated without changing a developing solution in a development tank for a long period of time, by adding to the developing solution, an aqueous solution (replenishment solution) having alkali strength which is the same as or higher than that of a developing solution. Also in this present invention, this replenishing method is preferably applied.

Various surfactants and organic solvents and the like can be added to a developing solution and replenishment solution, if necessary, for the purpose of enhancing promotion or suppression of developing property, dispersion of development residue, and affinity with ink of image portions on a printed plate. As the preferable surfactant, anionic, cationic, nonionic and ampholytic surfactants are listed. As the preferable organic solvent, benzyl alcohol and the like are listed. Further, addition of polyethylene glycol or derivatives thereof, or polypropylene glycol or derivative thereof, and the like is also preferable. Further, non-reduced sugars such as arabitol, sorbitol, mannitol and the like can also be added.

Further, to a developing solution and replenishment solution, inorganic salt-based reducing agents such as hydroquinone, resorcin, sodium salts and potassium salts and the like of sulfurous acid or hydrogen sulfurous acid, further, organic carboxylic acids, defoaming agents, hard water softening agents, can also be added, if necessary.

As the developing solution containing such surfactants, organic solvents and reducing agents and the like, for example, a developer composition composed of benzyl alcohol, anionic surfactant, alkali agent and water described in JP-A No. 51-77401, a developer composition composed of benzyl alcohol, anionic surfactant, and aqueous solution containing a water-soluble sulfurous acid described in JP-A No. 53-44202, a developer composition composed containing an organic solvent having solubility in water at normal temperature of 10 wt % or less, alkali agent, and water described in JP-A No. 55-155355, and the like are listed, and used suitably also in the present invention.

The printing plate subjected to development treatment using the above-mentioned developing solution and replenishment solution is subjected to post treatment with a washing solution, a rinsing solution containing surfactants and the like, or a de-sensitizing solution containing gum arabic and a starch derivative. These treatments can be variously combined and used as the post treatment when the image formation material of the present invention is used as a printing plate.

Recently, automatic developing machines for a printing plate are being widely used for rationalization and standardization of plate production operation, in plate production and printing industries. This automatic developing machine is, in general, composed of a development section and a post treatment section, and comprises an apparatus for transporting a printing plate, treating solution vessels, and a spray apparatus, and in which developing treatment is conducted by spraying treating solutions sucked up by a pump through spray nozzles while horizontally transporting a printing plate which has been exposed. Further, recently, there is also known a method in which a printing plate is treated by being immersed and transported by a submerged guide roll in a treating solution vessel filled with a treatment solution. In such automatic treatment, treatment can also be conducted while replenishing a treatment solution with a replenishment solution in accordance with the treatment amount, working time and the like. Further, automatic replenishment can also be conducted by sensing electric conductivity by a sensor.

Further, a so-called disposable treatment method in which treatment is effected with a substantially unused treating solution can also be used.

The planographic printing plate obtained as described above can be, after application of desensitizing gum if necessary, subjected to a printing process, and when a planographic printing plate having higher printing endurance is desired, burning treatment can be performed.

When a planographic printing plate is subjected to burning treatment, it is preferable to conduct treatment with a surface smoothing solution as described in JP-B Nos. 61-2518 and 55-28062, JP-A Nos. 62-31859 and 61-159655, before the burning treatment.

As this method, a method in which the surface smoothing solution is applied on a planographic printing plate by using sponge or absorbent cotton soaked with this solution, a method in which a printing plate is immersed in a vat filled with a surface smoothing solution to effect application on the plate, a method by an automatic coater, and the like are applied. Further, a more preferable results is obtained if, after application, the applied amount is made uniform by a squeeze or squeeze roller.

The amount of a surface smoothing solution applied is, in general, suitably from 0.03 to 0.8 $g/m^2$ (dry weight).

The planographic printing plate on which a surface smoothing agent has been applied is dried if necessary, then, heated to high temperatures by a burning processor (for example, Burning Processor: "BP1300", available from Fuji Photo Film Co., Ltd.) and the like. In this case, it is preferable that the heating temperature is from 180 to 300° C. and the heating time is from 1 to 20 minutes depending on the kinds of components forming images.

On the planographic printing plate which has been subjected to burning treatment, conventionally conducted treatments such as washing with water, gum drawing and the like can be performed appropriately if necessary, however, when a surface smoothing solution containing a water-soluble polymer compound and the like is used, so-called desensitizing treatments such as gum drawing and the like can be omitted.

The planographic printing plate obtained by such treatments is subjected to treatment by an offset printing machine, and used for printing of a large number of sheets.

EXAMPLES

The following examples illustrate the present invention, but do not limit the scope of the present invention.

Example 1

[Production of Substrate]

A JIS A 1050 alloy forging solution containing 99.5% or more of aluminum, 0.30% of Fe, 0.10% of Si, 0.02% of Ti and 0.013% of Cu was purified, and molded. In the purification treatment, de-gassing treatment was conducted for removing unnecessary gases such as hydrogen and the like from the forging solution, and ceramic tube filter treatment was conducted. The molding method was conducted according to a DC molding method. A solidified ingot having a plate thickness of 500 mm was scraped 10 mm from the surface, and subjected to homogenizing treatment at 550° C. for 10 hours so that an intermetallic compound did not become coarse. Then, it was hot-rolled at 400° C., and subjected to intermediate annealing at 500° C. for 60 seconds in a continuous annealing furnace, then, subjected to cold rolling, to obtain an aluminum rolled plate having a plate thickness of 0.30 mm. By controlling the roughness of a rolling roll, the average surface roughness at the center liner Ra after cold rolling was regulated to 0.2 $\mu$m. Then, it was subjected to a tension leveler for improving flatness.

Then, surface treatment was conducted to obtain a substrate for a planographic printing plate.

First, to remove a rolling oil on the surface of the aluminum plate, de-greasing treatment was conducted at 50° C. for 30 seconds with a 10% sodium aluminate aqueous solution, and neutralized with a 30% sulfuric acid aqueous solution at 50° C. for 30 seconds, and then smut removal treatment was conducted.

Roughening of the surface of the substrate, so-called graining treatment, was conducted for improving close adherence of the substrate with the photosensitive layer, and for imparting water-retaining property to non-image portions. An aqueous solution containing 1% of nitric acid and 0.5% of aluminum nitrate was kept at 45° C., and electrolytic graining was conducted by applying a current density of 20 A/dm² by an indirect feeding cell and an anode side electricity quantity of 240 C/dm² at an alternating waveform with a duty ratio of 1:1, while flowing an aluminum web through the aqueous solution. Then, etching treatment was conducted at 50° C. for 30 seconds with a 10% sodium aluminate aqueous solution, neutralization was effected at 50° C. for 30 seconds with a 30% sulfuric acid aqueous solution, and smut removal treatment was conducted.

Further, an oxide film was formed on the substrate by anodizing for improving abrasion-resistance, chemical resistance and water-retaining property. As the electrolyte, a 20% sulfuric acid aqueous solution was used at 35° C., and an anodized film of 2.5 g/m² was formed by conducting electrolysis treatment using direct current of 14 A/dm² from an indirect feeding cell, while transporting an aluminum web through the electrolyte.

Thereafter, for securing hydrophilic property for non-image portions of a printing plate, silicate treatment was conducted. In the treatment, a 1.5% aqueous solution of No. 3 sodium silicate was kept at 70° C., and transported so that the contact time of an aluminum web was 15 seconds, and further washed with water. The adhered amount of Si was 10 mg/M². Ra (surface roughness at center line) of the substrate produced as described above was 0.25 $\mu$m.

[Priming]

Then, the following priming solution was applied by a wire bar onto this aluminum substrate, and dried at 90° C. for 30 seconds using a hot air type drying apparatus. The coating amount after drying was 10 mg/M².

<Primer solution>

| | |
|---|---|
| Copolymer of ethyl methacrylate and sodium 2-acrylamide-2-methyl-1-propanesulfonate of molar ratio of 75:15 | 0.1 g |
| 2-Aminoethylphosphonic acid | 0.1 g |
| Methanol | 50 g |
| Ion exchanged water | 50 g |

[Photosensitive Layer]

Then, the following photosensitive layer application solution [P-1] was prepared, and applied using a wire bar on the above-mentioned primed aluminum plate, and dried at 115° C. for 45 seconds by a hot air type drying apparatus to form a photosensitive layer. The coating amount after drying was in the range from 1.2 to 1.3 g/m².

<Photosensitive Application Solution [P-1]>

| | |
|---|---|
| Infrared absorber (IR-6) | 0.08 g |
| Onium salt (SB-1) | 0.30 g |
| Dipentaerythritolhexaacrylate | 1.00 g |
| Copolymer of allyl methacrylate with methacrylic acid of molar ratio of 80:20 (weight-average molecular weight: 120,000) | 1.00 g |
| Victoria Pure Blue naphthalene sulfonate salt | 0.04 g |
| Silicon-based surfactant (TEGO GLIDE100 (trade name), manufactured by Tego Chemie Service GmbH) | 0.03 g |
| Methyl ethyl ketone | 9.0 g |
| Methanol | 10.0 g |
| 1-Methoxy-2-propanol | 8.0 g |

Structure of the infrared absorber (IR-6) and the onium salt (SB1) used in the above-mentioned photosensitive layer application solution [P-1] are as described below.

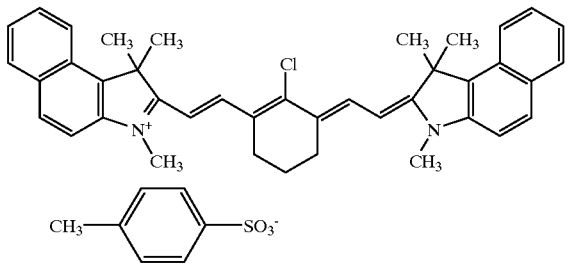

[IR-6]

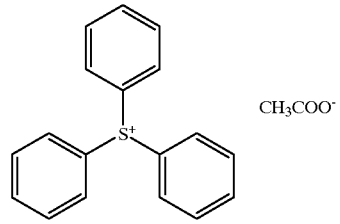

(SB-1)

[Overcoat Layer]

Then, 20 g of polyvinyl alcohol (saponification degree 98.5%, polymerization degree 500) was dissolved in 480 g of distilled water to prepare an application solution for an overcoat layer, and applied with wire bar on the above-mentioned aluminum plate carrying the photosensitive layer formed, and dried at 100° C. for 3 minutes by a hot air type drying apparatus to form an overcoat layer, and a negative planographic printing plate [P-1] was thereby obtained (Example 1). The coating amount after drying was 2.2 g/m².

<Evaluation of Planographic Printing Plate>
[Evaluation of Application Solution Face Flatness]

The applied face flatness of the resulted negative planographic printing plate [P-1] was evaluated by being observed. Planographic printing plate having uniform surface and no unevenness is favorable.

[Evaluation of Sensitivity and Storage Stability]
(Exposure)

The obtained negative planographic printing plate [P-1] was exposed by Trendsetter3244VFS manufactured by Creo and equipped with water-cooling type 40W infrared ray semiconductor laser, while controlling the laser output and the revolution of an outer drum, at a plate surface energy within the range from 10 mJ/cm² to 200 mJ/cm², and at a resolution of 2400 dpi, the plate surface energy being controlled to change at a rate of 10 mJ/cm².

(Development Treatment)

After exposure, development treatment was conducted using an automatic development machine, Stubron 900N, manufactured by Fuji Photo Film Co., Ltd. As the developing solution, the following alkaline aqueous solution was used both for a charging solution and replenishment solution. pH was 11.7. The temperature of the development bath was 30° C. As the finisher, a 1:1 water diluted solution of FN-6 manufactured by Fuji Photo Film Co., Ltd. was used.

(Developing Solution)

| | |
|---|---|
| Potassium hydroxide | 3.8 g |
| Polyethylene glycol mononaphthyl ether | 250 g |
| Tetrasodium ethylenediamine tetraacetate | 8 g |
| Water | 738.2 g |

After development treatment, plate surface energy at which the concentration of image portions was sufficient was determined by observation of the image, and this value was recognized as sensitivity. Further, the negative planographic printing plate [P-1] was stored for 5 days under a temperature of 40° C. and a humidity of 80%, then, subjected to exposure and development treatments, and sensitivity after storage was evaluated, in the same manner. The results are shown in table 1. The smaller the difference between sensitivity directly after production and sensitivity after storage is, the greater the storage stability is.

Further, the planographic printing plate [P 1] was printed using a Lisron printer, manufactured by KOMORI Corporation K.K. In this procedure, the obtained print was evaluated by being observation, and presence or absence of defect due to scratching on image portions and white void was observed. The results are shown in Table 1.

Comparative Example 1

A photosensitive layer application solution [P-2] was produced in the same manner as in Example 1 except that 0.03 g of Megafac F-176 which is a fluorine-based surfactant was used instead of the silicon-based surfactant used in the photosensitive layer application solution [P-1], and a negative planographic printing plate [P-2] of Comparative Example 1 was obtained in the same manner as in Example 1 except that the photosensitive layer application solution [P-2] was used. This was evaluated in the same manner as in Example 1. The results are shown in the following Table 1.

Comparative Example 2

A photosensitive layer application solution [P-3] was produced in the same manner as in Example 1 except that the silicon-based surfactant used in the photosensitive layer application solution [P-1] was not added, and a negative planographic printing plate [P-3] of Comparative Example 2 was obtained in the same manner as in Example 1 except that the photosensitive layer application solution [P-3] was used. This was evaluated in the same manner as in Example 1. The results are shown in the following Table 1.

TABLE 1

| | Example 1 | Comparative Example 1 | Comparative Example 2 |
|---|---|---|---|
| Planographic printing plate | [P-1] | [P-2] | [P-3] |
| Face flatness | Uniform | Uniform | Striped unevenness |
| Sensitivity directly after production | 100 | 100 | 120 |
| Sensitivity after storage | 100 | 120 | 160 |
| Defect of image portions | None | Slight | Significant |

As apparent from Table 1, when a photosensitive layer is formed, the photosensitive layer application solution of Example 1 of the present invention is excellent in face flatness, the obtained planographic printing plate has excellent storage stability, and it reveals no reduction in sensitivity even if it is stored under high temperature and high humidity. Also it is not scratched easily even if it is stored before treatment, and it can provide a print having excellent image quality with no defects on image portions.

On the other hand, in Comparative example 1 using a fluorine-based surfactant, face flatness thereof is excellent, however, slight reduction in sensitivity and scratching due to storage were observed, and in Comparative Example 2 in which no surfactant was added, striped unevenness occurred on the application surface of the photosensitive layer, and also in evaluation of storage stability, significant reduction in sensitivity and scratch on the plate surface were found.

Example 2

[Synthesis of Crosslinking Agent A-1]

p-Aminophenol (1 mol) and sodium acetate (1 mol) were charged in a flask together with acetone (1 liter), and to this formic chloride (1 mol) was added dropwise while cooling with ice. 5 hours after, it was placed into ice water to cause precipitation, the obtained crystals were filtrated, to obtain A-1-x at a yield of 75%. This A-1-x (0.75 mol) and KOH (0.75 mol), 500 ml of water, and a 37% formalin aqueous solution (4.0 mol) were charged in a flask, and heated at 50 for 5 hours, and placed into 5 liters of acetone, to precipitate crystals, these crystals were filtrated and was dissolved in 100 ml of water, then, the solution was neutralized with potassium hydrogen sulfate to cause crystallization. This was filtrated to obtain the desired A-1 at a total yield of 60%. The structure of the crosslinking agent A-1 is as follows.

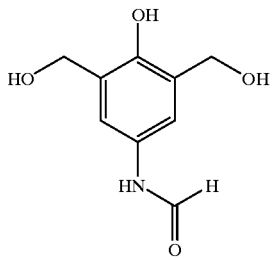

A-1

[Formation of Substrate]

An aluminum plate (material 1050) having a thickness of 0.30 mm was washed with trichloroethylene and degreased, then, the surface was grained using a nylon brush and a 400 mesh pumice stone-water suspension, and sufficiently washed with water. This plate was immersed into a 25% sodium hydroxide aqueous solution at 45° C. for 9 seconds to effect etching, and washed with water, then, further immersed into 2% $HNO_3$ for 20 seconds, and washed with water. In this procedure, the amount of the grained surface etched was about 3 $g/m^2$. Then, this plate was treated using 7% $H_2SO_4$ as an electrolyte to provide a direct current anodized film of 3 $g/m^2$ at a current density of 15 $A/dm^2$, then washed with water and dried. Then, the following primer solution was applied on this aluminum plate, and dried at 80° C. for 30 seconds. The coating amount after drying was 10 $mg/m^2$.

[Primer Solution]

| | |
|---|---|
| β-Alanine | 0.1 g |
| Phenylphosphonic acid | 0.05 g |
| Methanol | 40 g |
| Pure water | 60 g |

[Photosensitive Layer]

Then, the following photosensitive layer application solution [Q1] was prepared, an applied with a wire bar on the above-mentioned primed aluminum plate, and dried at 100° C. for 1 minute by a hot air drying apparatus, to form a photosensitive layer. The coating amount after drying was 1.4 $g/m^2$.

<Photosensitive Layer Application Solution [Q-1]>

| | |
|---|---|
| Crosslinking agent (mixture of A-1/II-2 at weight ratio of 50/50) | 0.6 g |
| Binder polymer (BX-1) | 1.4 g |
| Acid generator (SX-1) | 0.2 g |
| Infrared absorber (DX-1) | 0.2 g |
| Coloring agent (VPB-Naps: manufactured by Hodogawa Chemical Co., Ltd.) | 0.04 g |
| Silicon-based surfactant (TEGO GLIDE100 (trade name), manufatured by Tego Chemie Service GmbH) | 0.03 g |
| Methyl ethyl ketone | 1.2 g |
| Methanol | 15.8 g |
| 1-Methoxy-2-propanol | 10.0 g |

The binder polymer (BX1) refers to poly-p-hydroxystyrene (trade name: Malka Linker MH2P, manufactured by Maruzen Sekiyu K. K.). The structures of the crosslinking agent II-1, acid generator (SX1) and the infrared absorber (DX-1) used in the above-mentioned photosensitive layer application solution [Q-1] are as shown below.

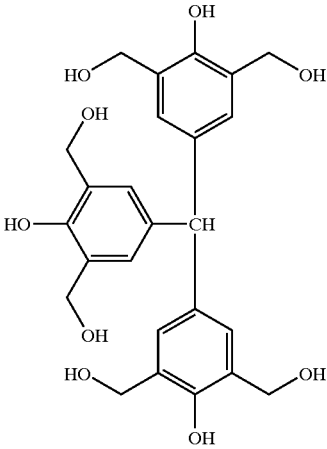

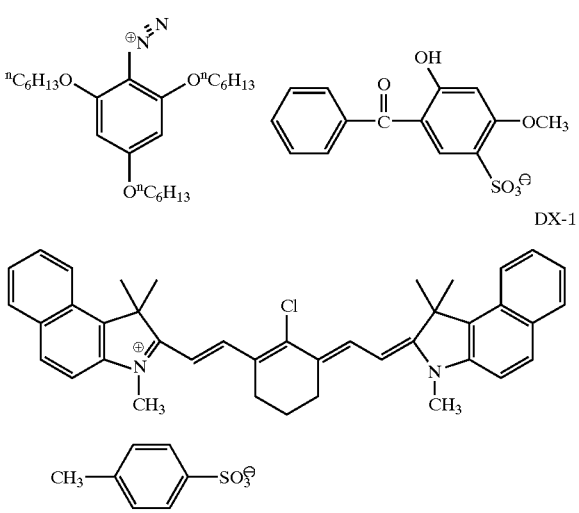

(Exposure)

The obtained negative planographic printing plate [Q- I] was scan-exposed with semiconductor laser emitting infrared rays having a wavelength from 830 to 850 nm, at a plate surface energy within the range from 10 $mJ/cm^2$ to 220 $mJ/cm^2$, the plate surface energy being controlled to change at a rate of 10 $mJ/cm^2$. After exposure, heat treatment was conducted at 110° C. for 15 seconds by a panel heater.

(Development Treatment)

After exposure, development treatment was conducted using an automatic development machine, Stubron 900N, manufactured by Fuji Photo Film Co., Ltd. As the developing solution, a developing solution, DP-4 (1:8 water diluted solution), manufactured by Fuji Photo Film Co., Ltd. was used for a charging solution, and DP-4RW (1:4 water diluted solution), manufactured by Fuji Photo Film Co., Ltd. was used for a replenishing solution. The temperature of the development bath was 30° C. As the finisher, a 1:1 water diluted solution of FN-6 manufactured by Fuji Photo Film Co., Ltd. was used.

As described above, sensitivity and storage stability were evaluated in the same manner as in Example 1 except that the exposure and development treatment conditions were changed. The results are show in the following Table 2.

Comparative Example 3

A photosensitive layer application solution [Q-2] was produced in the same manner as in Example 2 except that 0.03 g of Megafac F-176 which is a fluorine-based surfactant was added instead of the silicon-based surfactant used in the photosensitive layer application solution [Q-1], and a negative planographic printing plate [Q-2] of Comparative Example 3 was obtained in the same manner as in Example 2 except that the photosensitive layer application solution [Q-2] was used. The planographic printing plate was evaluated in the same manner as in Example 2. The results are shown in the following Table 2.

Comparative Example 4

A photosensitive layer application solution [Q-3] was produced in the same manner as in Example 2 except that the silicon-based surfactant used in the photosensitive layer application solution [Q-1] was not added, and a negative planographic printing plate [Q-3] of Comparative Example 2 was obtained in the same manner as in Example 2 except that the photosensitive layer application solution [Q-3] was used. This was evaluated in the same manner as in Example 2. The results are shown in the following Table 2.

TABLE 2

|  | Example 2 | Comparative Example 3 | Comparative Example 4 |
| --- | --- | --- | --- |
| Planographic printing plate | [Q-1] | [Q-2] | [Q-3] |
| Face flatness | Uniform | Uniform | Striped unevenness |
| Sensitivity directly after production | 160 | 160 | 170 |
| Sensitivity after storage | 160 | 180 | 200 |
| Defect of image portions | None | Slight | Significant |

As apparent from Table 2, when a photosensitive layer is formed, it was found that the photosensitive layer application solution of Example 2 of the present invention is excellent in face flatness, the obtained planographic printing plate has excellent storage stability, it reveals no reduction in sensitivity even if it is stored under conditions of high temperature and high humidity. Also it is not scratched easily even if it is stored before treatment, and it can provide a print having excellent image quality with no defect on image portions, as in the case of an acid crosslinking type photosensitive layer, like the light polymerizing type photosensitive layer of Example 1.

On the other hand, in Comparative example 3 using a fluorine-based surfactant, face flatness thereof is excellent, however, slight reduction in sensitivity and scratching due to storage were observed, and in Comparative Example 4 in which no surfactant was added, striped unevenness occurred on the application surface of the photosensitive layer, and also when storage stability was evaluated, significant reduction in sensitivity and scratch on the plate surface were found.

According to the present invention, there can be provided a negative planographic printing plate which can be directly recorded based on digital data from computers and the like by conducting recording using solid laser and semiconductor laser emitting infrared rays, and in which the photosensitive layer application solution reveals excellent face flatness, and which is excellent in storage stability, and gives a print having excellent image quality.

What is claimed is:

1. A negative planographic printing plate comprising:

a substrate, and a photosensitive layer disposed on the substrate, the photosensitive layer containing an infrared absorber, a compound which generates a radical due to heat, a polymerizable compound, a silicon surfactant, and a binder polymer that is soluble in or swellable with water or weak alkaline aqueous solution.

2. A negative planographic printing plate according to claim 1, wherein said silicon surfactant is an anionic surfactant.

3. A negative planographic printing plate according to claim 1, wherein said based silicon surfactant is a cationic surfactant.

4. A negative planographic printing plate according to claim 1, wherein said silicon surfactant is a nonionic surfactant.

5. A negative planographic printing plate according to claim 4, wherein said nonionic surfactant is a silicone surfactant composed of a siloxane/oxyethylene copolymer.

6. A negative planographic printing plate according to claim 1, wherein said infrared absorber is a compound selected from the group consisting of a dye and a pigment having an absorption maximum in a wavelength range from 760 nm to 1200 nm.

7. A negative planographic printing plate according to claim 1, wherein said infrared absorber is a compound selected from the group consisting of cyanine pigments, squarylium pigments, pyrylium salts, nickel thiolate complexes.

8. A negative planographic printing plate according to claim 1, wherein said compound which generates a radical is an onium salt selected from the group consisting of iodonium salts, diazonium salts and sulfonium salts.

9. A negative planographic printing plate according to claim 8, wherein said onium salt is included in the photosensitive layer application solution in a proportion of from 0.1 to 50% by weight based on the total weight of all solid components in the photosensitive layer application solution.

10. A negative planographic printing plate according to claim 1, wherein said binder polymer is a linear organic polymer.

11. A negative planographic printing plate according to claim 1, wherein said photosensitive layer is a photosensitive layer containing said binder polymer in an amount of from 20 to 95% by weight based on the total weight of all solid components in the photosensitive layer application solution.

12. A negative planographic printing plate according to claim 1, wherein said photosensitive layer is a photosensitive layer containing an alkaline water-soluble polymer compound.

13. A negative planographic printing plate according to claim 1, wherein said photosensitive layer is a photosensitive layer containing a coloring agent.

14. A negative planographic printing plate according to claim 1, wherein said photosensitive layer is a photosensitive layer containing a heat polymerization inhibitor.

15. A negative planographic printing plate according to claim 1, wherein said photosensitive layer is a photosensitive layer containing a plasticizer.

16. A negative planographic printing plate according to claim 1 comprising an overcoat layer provided on said photosensitive layer.

17. A negative planographic printing plate comprising:
a substrate and
a photosensitive layer disposed on the substrate, the photosensitive layer being obtained by applying a photosensitive layer application solution containing an infrared absorber, a compound which generates a radical due to heat, a polymerizable compound, a silicon surfactant, and a binder polymer that is soluble in or swellable with water or weak alkaline aqueous solution, onto the substrate and drying the solution, and by being hardened by exposure to an infrared laser ray.

18. A negative planographic printing plate according to claim 17, wherein said photosensitive layer application solution is an application solution containing said silicon surfactant in an amount of 0.01 to 8% by weight based on the total weight of all non-volatile components in the photosensitive layer.

* * * * *